US006836867B2

(12) United States Patent
Yonetoku

(10) Patent No.: US 6,836,867 B2
(45) Date of Patent: Dec. 28, 2004

(54) METHOD OF GENERATING A PATTERN FOR TESTING A LOGIC CIRCUIT AND APPARATUS FOR DOING THE SAME

(75) Inventor: Hirofumi Yonetoku, Kanagawa (JP)

(73) Assignee: NEC Electronics Corporation, Kawasaki (JP)

( * ) Notice: Subject to any disclaimer, the term of this patent is extended or adjusted under 35 U.S.C. 154(b) by 461 days.

(21) Appl. No.: 09/950,767

(22) Filed: Sep. 13, 2001

(65) Prior Publication Data

US 2002/0059546 A1 May 16, 2002

(30) Foreign Application Priority Data

Sep. 13, 2000 (JP) ........................................ 2000-277651

(51) Int. Cl.$^7$ .............................................. G01R 31/28
(52) U.S. Cl. ...................................... 714/738; 714/741
(58) Field of Search ................................ 714/737, 739, 714/724, 726, 738, 741, 742

(56) References Cited

U.S. PATENT DOCUMENTS 6,052,809 A * 4/2000 Bowden ..................... 714/738

FOREIGN PATENT DOCUMENTS

| JP | 5-341011 | 12/1993 |
| JP | 6-52005 | 2/1994 |
| JP | 7-55895 | 3/1995 |
| JP | 7-191102 | 7/1995 |
| JP | 9-145800 | 6/1997 |
| JP | 11-83959 | 3/1999 |
| JP | 2953975 | 7/1999 |
| JP | 2000-329831 | 11/2000 |

OTHER PUBLICATIONS

Ayari, B., and Kaminska, B. "A New Dynamic Test Vector Compaction for Automatic Test Pattern Generation", *IEEE Transactions on Computer–Aided Design of Integrated Circuits and Systems*, vol. 13, No. 3, Mar. 1994, pp. 353–358.
Amin, M. B., and Vinnakota, B. "ZAMBEZI: A Parallel Pattern Parallel Fault Sequential Circuit Fault Simulator", paper presented at the 1996 14th IEEE VLSI Test Symposium; Apr. 28–May 1, 1996; pp. 438–443.

* cited by examiner

*Primary Examiner*—Albert Decady
*Assistant Examiner*—James C. Kerveros
(74) *Attorney, Agent, or Firm*—McGinn & Gibb, PLLC

(57) ABSTRACT

A method of generating a pattern for testing a logic circuit includes judging whether generation of a test pattern is to be undertaken. If it is judged that generation of a test pattern is to be undertaken, a fault is selected for which the test pattern is to be generated. Generation is attempted of at least one test pattern necessary for detecting the selected fault. Fault simulation is carried out to find a test pattern, from among copies of the at least one test pattern, by which the most undetected faults are detected. If at least one test pattern is generated, the test pattern is re-activated.

24 Claims, 16 Drawing Sheets

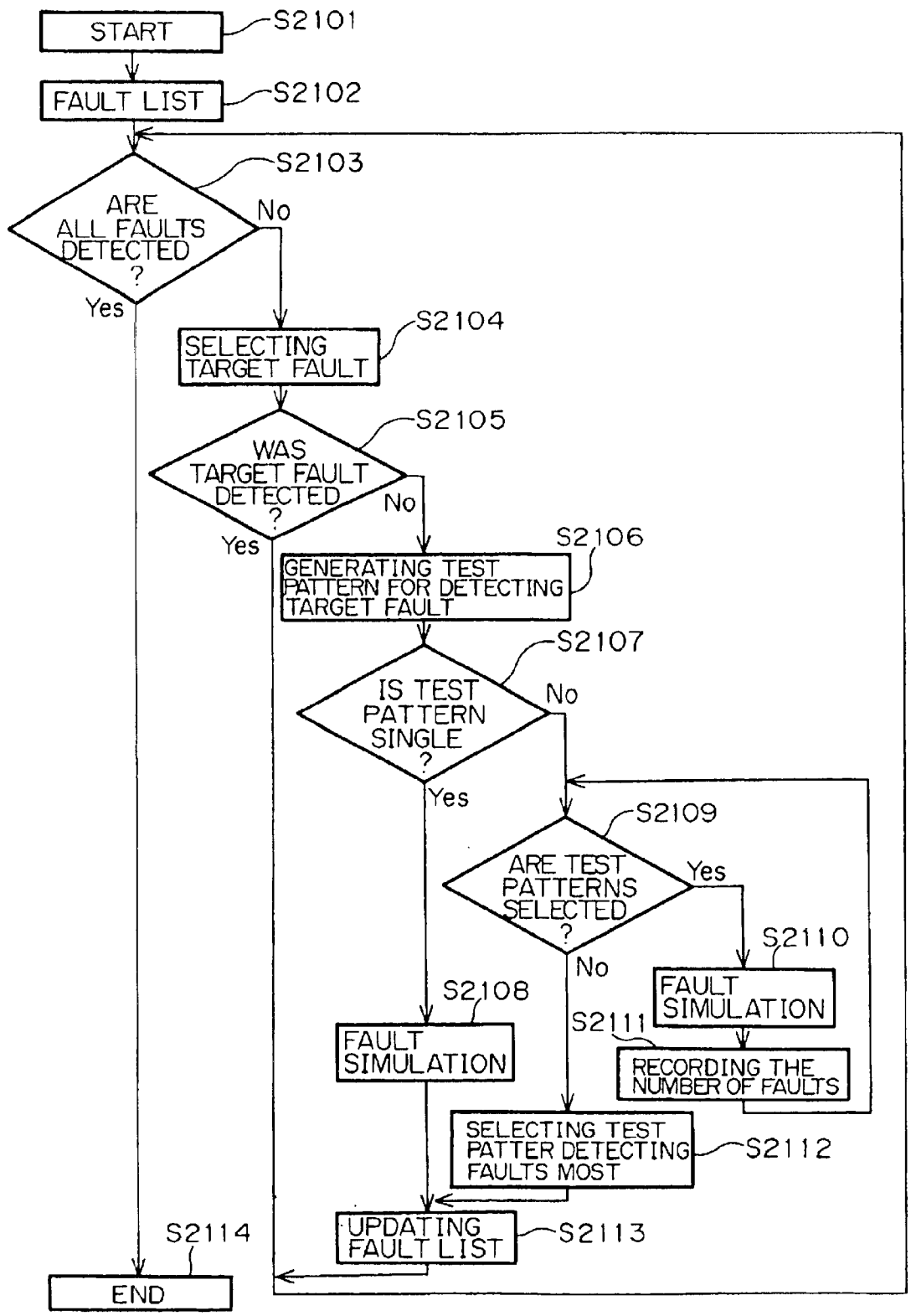

FIG.3A
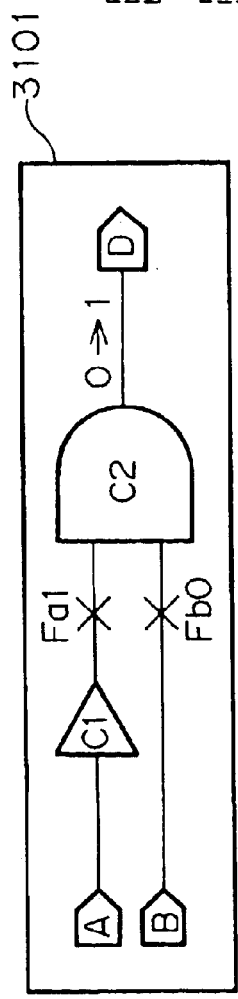
FIG.3B
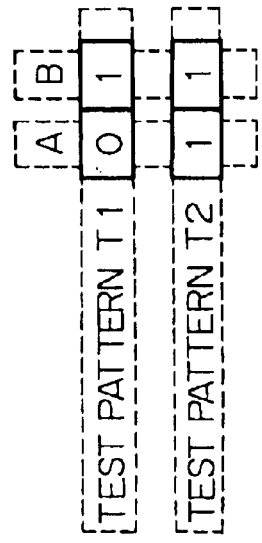
FIG.3C
FAULT DEFINITION
1 STUCK FAULT AT EXTERNAL INPUT TERMINAL A OF AND GATE C2:Fa1
0 STUCK FAULT AT EXTERNAL INPUT TERMINAL B OF AND GATE C2:Fb0

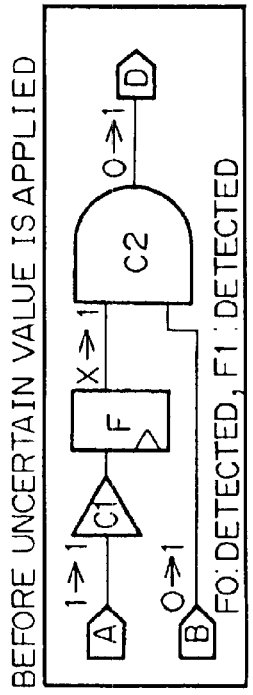
F I G. 8D
BEFORE UNCERTAIN VALUE IS APPLIED
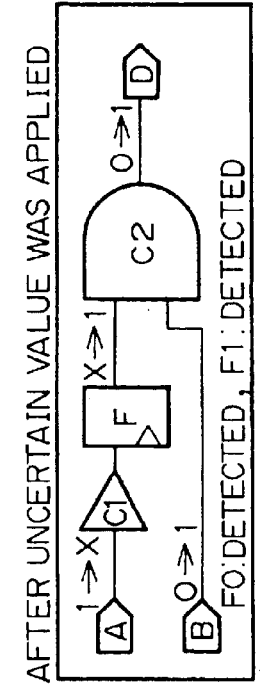
F I G. 8E
AFTER UNCERTAIN VALUE WAS APPLIED
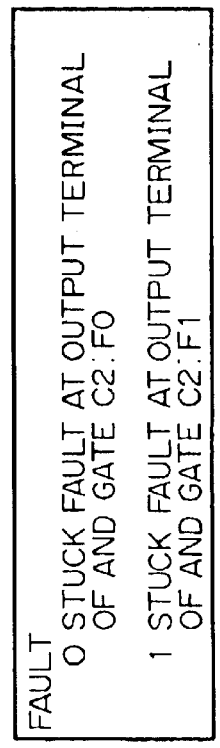
F I G. 8F
FAULT
0 STUCK FAULT AT OUTPUT TERMINAL OF AND GATE C2:F0
1 STUCK FAULT AT OUTPUT TERMINAL OF AND GATE C2:F1
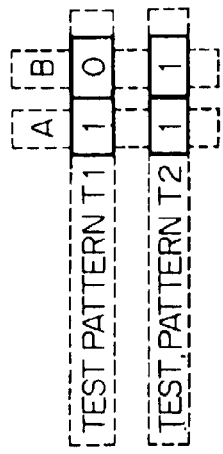
F I G. 8A
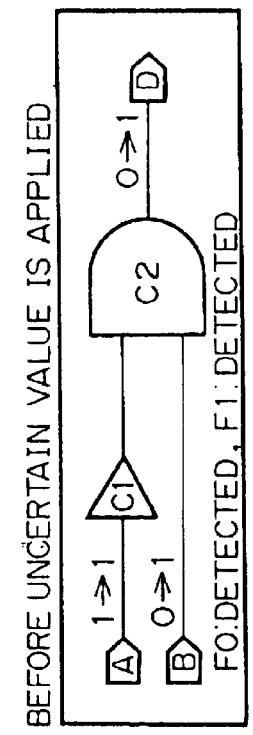
F I G. 8B
BEFORE UNCERTAIN VALUE IS APPLIED
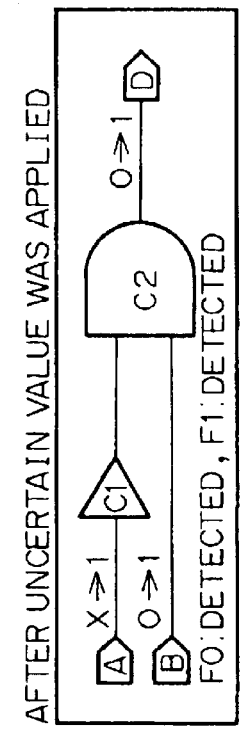
F I G. 8C
AFTER UNCERTAIN VALUE WAS APPLIED

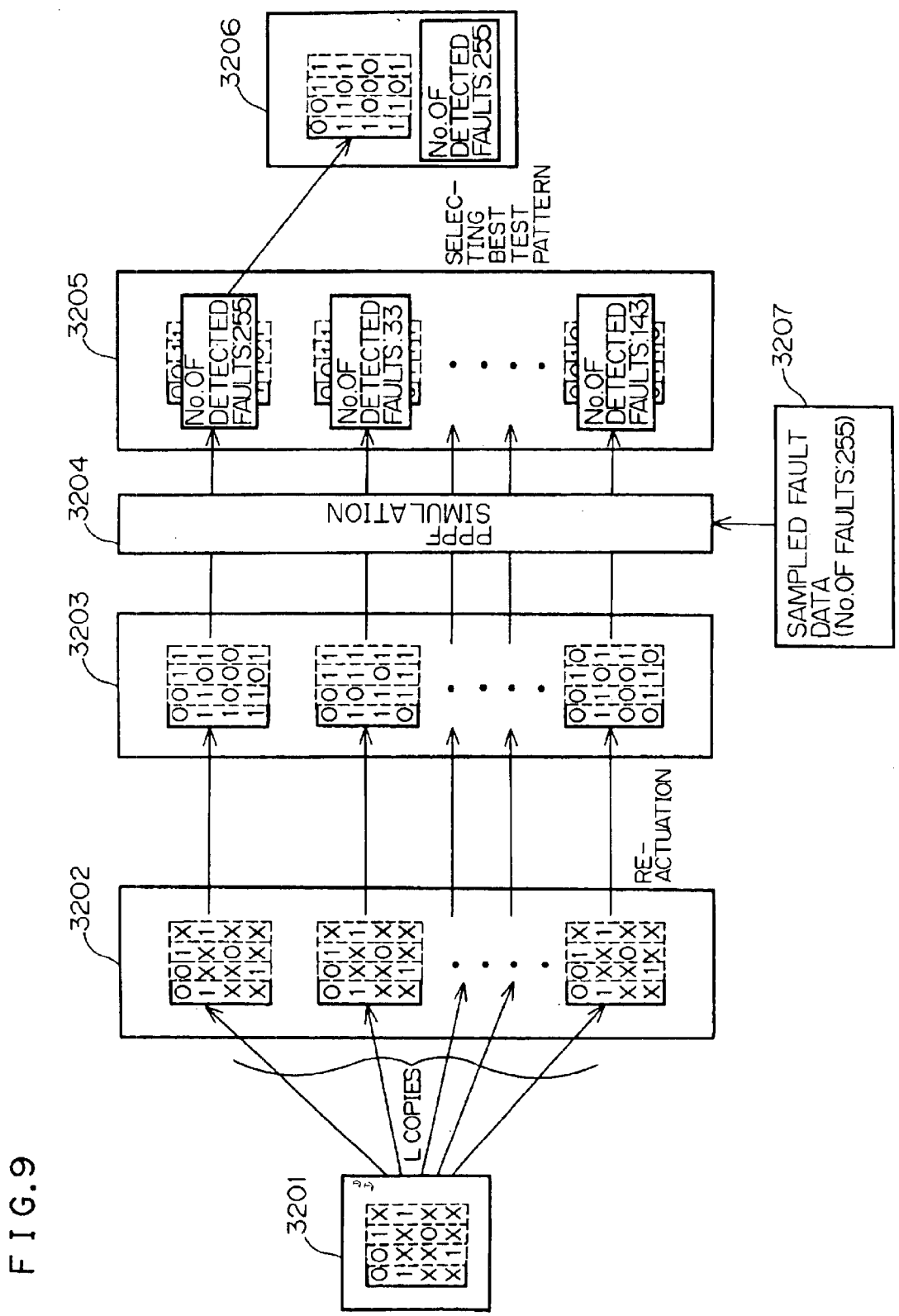

METHOD OF GENERATING A PATTERN FOR TESTING A LOGIC CIRCUIT AND APPARATUS FOR DOING THE SAME

BACKGROUND OF THE INVENTION

1. Field of the Invention

The invention relates to a method of and an apparatus for generating a pattern for testing a logic circuit, and more particularly to such a method and an apparatus which are capable of shortening a length of a test pattern generated by an automatic test pattern generation (ATPG) system used for a combinational circuit and an automatic test pattern generation system used for a sequential circuit.

2. Description of the Related Art

As a scale of an integrated circuit such as LSI has become larger recently, a cost for testing an integrated circuit becomes higher. One of factors on which a cost for testing an integrated circuit is dependent is the number of patterns for testing an integrated circuit. Less the number of test patterns is, shorter a period of time necessary for testing an integrated circuit is, ensuring that it is possible to shorten a period of time for using an expensive LSI tester, and hence, testing costs can be significantly reduced. Accordingly, there is a need of a method of reducing the number of test patterns.

In general, a test pattern generated by an automatic test pattern generation (ATPG) system used for a sequential circuit is different from a test pattern generated by an automatic test pattern generation system used for a combinational circuit, as follows.

The first difference is that a fault can be always detected by means of a signal test pattern in a combinational circuit, whereas a plurality of test patterns has to be used for testing a fault in many cases in a sequential circuit. Accordingly, the number of test patterns generated by an ATPG system used for a sequential circuit is likely to increase.

The second difference is as follows. In test patterns generated by an ATPG system used for a combination system, even if arrangement of respective test patterns were varied, a fault detecting rate obtained in an original arrangement of test patterns is not reduced. In contrast, in test patterns generated by an ATPG system used for a sequential system, if arrangement of respective test patterns were varied, there is often obtained a fault detecting rate which is lower than a fault detecting rate obtained in all original arrangement of test patterns. The reason is as follows. Since a sequential circuit includes a memory such as flip-flop (F/F) circuit, a value transmitted through an output terminal of the sequential circuit at a certain time is dependent on both a test pattern having been input into an input terminal of the sequential circuit and a logical value of a flip-flop circuit or internal condition of the sequential circuit at the certain time. Accordingly, if arrangement of respective test patterns were varied, the internal condition of the sequential circuit is also varied, resulting in that a fault which can be detected before the arrangement is varied can be no longer detected.

There is an increasing need for shortening a length of a test pattern generated by an ATPG system used for a sequential circuit, that is, a need for strengthening a function of test pattern compaction.

For instance, Japanese Unexamined Patent Publication No. 2000-329831 published on Nov. 30, 2000 has suggested an apparatus for compacting test patterns used for a combinational circuit in an ATPG system (hereinafter, the Publication is referred to as first prior art).

Though the first prior art is explained later, it should be noted that the applicant does not admit that the first prior art constitutes statutory prior art to the present invention. The first prior art is referred to herein merely for the purpose of better understanding of the present invention.

Japanese Unexamined Patent Publication No. 5-341011 has suggested a method of generating a test pattern (hereinafter, the Publication is referred to as second prior art).

The article identified below provides explanation about test pattern compaction in a logic circuit: B. Ayari and B. Kaminska, "A New Dynamic Test Vector Compaction for Automatic Test Pattern Generation", IEEE Trans. Computer-Aided Design, Vol. 13, No. 3, Mar. 1994, pp. 353–358 (hereinafter, the article is referred to as the article A).

As introduced in the second chapter "Previous Work" in the article A, test pattern compaction is grouped into static compaction and dynamic compaction. In the static compaction, all test patterns which can detect faults are generated before test pattern compaction is carried out, and thereafter, test pattern compaction is carried out independently of generation of test patterns. In the dynamic compaction, automatic generation of test patterns which can detect faults and test pattern compaction for reducing the total number of test patterns are simultaneously carried out.

FIG. 1 is a flow chart showing steps to be carried out in the test pattern compaction in accordance with the first prior art. The test pattern compaction disclosed in the first prior art belongs to static compaction, and carries out the steps shown in FIG. 1 to conduct test pattern compaction.

With reference to FIG. 1, first, circuit data and fault data are received, in the step S2001.

Then, there is generated test patterns to detect all faults, in the step S2002.

Then, arrangement of the thus generated test patterns is varied, in the step S2003.

Then, a logical value "1" or "0" is assigned to a primary input (PI) having a uncertain value (X value), among the test patterns, to thereby re-activate the test patterns, in the step S2004.

Then, fault simulation is conducted to the re-activated test patterns to identify the primary inputs which are not relevant to detection of all the faults, in all the test patterns, and assign uncertain values to the primary inputs, in the step S2005.

Then, test patterns which can be combined to one another are combined to one another among the test patterns to which the uncertain values were assigned, to thereby reduce the number of the test patterns, in the step S2006.

If the number of the test patterns is not adequately reduced, the steps S2003 to S2006 are repeated. If the number of the test patterns is adequately reduced, the compacted test patterns are output externally, in the step S2007. Thus, the test pattern compaction is completed.

FIG. 2 is a flow chart showing steps to be carried out in the test pattern compaction disclosed in the second prior art. The test pattern compaction disclosed in the second prior art belongs to dynamic compaction, and carries out steps shown in FIG. 2 to generate test patterns.

Generation of test patterns starts in the step S2101, and then, there is made a fault list indicating faults to which test patterns are to be generated, in the step S2102.

Then, it is checked as to whether all faults are detected, in the step S2103.

If all the faults are detected (YES in the step S2103), generation of test patterns is finished in the step S2114.

If all the faults are not detected (NO in the step S2103), one of the faults is selected from the fault list at that time, in the step S2104. The thus selected fault is called a target fault.

Then, it is checked as to whether the test patterns having been generated so far have detected the target fault, in the step S2106.

If the target fault has been detected (YES in the step S2105), the step S2103 is repeated.

If the target fault has not been detected (NO in the step S2105), a test pattern for detecting the target fault is generated, in the step S2106.

Then, it is checked as to whether the thus generated test pattern is single or not, in the step S2107.

If the generated test patter is plural (NO in the step S2107), it is checked as to whether a plurality of test patterns is selected among the test patterns, in the step S2109.

If a plurality of test patterns is selected (YES in the step S2109), fault simulation is conducted to one of the test patterns, in the step S2110.

Then, the number of faults having been detected in the test pattern to which the fault simulation was conducted is recorded, in the step S2111. The steps S2110 and S2111 are carried out to all the test patterns selected in the step S2109.

If only one test pattern remains (NO in the step S2109), a test pattern which detected faults most is selected as a test pattern for the target fault, in the step S2112.

Then, the fault list is updated in the step S2113. Thereafter, the step S2103 is repeated.

However, the above-mentioned first and second prior art are accompanied with problems, as follows.

The steps S2003 and S2006 in the first prior art can not be applied to a sequential circuit, and hence, it is not possible to repeat those steps for enhancing advantages obtained by those steps. As a result, the first prior art is accompanied with a problem that an advantage of enhancing the test pattern compaction by repeating those steps can not be obtained in a sequential circuit.

The test pattern compaction disclosed in the second prior art is accompanied with a problem that since the fault simulation is conducted to each of the test patterns selected in the step S2110, the number of the fault simulation unavoidably increases, and it would take much time to conduct the fault simulation.

Japanese Unexamined Patent Publication No. 9-145800 has suggested a method of generating a test pattern, including the steps of (a) selecting a fault to be detected, in a circuit for which a test pattern is generated, (b) selecting a target fault among the faults having been identified in the step (a), (c) generating a test pattern for the target fault, (d) conducting fault simulation to the test patterns generated in the step (c) with respect to all the faults selected in the step (a), and (e) determining faults which cannot be detected by means of the test patterns, as target faults. The steps (c) to (e) are repeated to generate test patterns which can detect all the faults selected in the step (a).

Japanese Unexamined Patent Publication No. 7-55895 has suggested a method of generating a test pattern for detecting a fault in LSI, including the steps of detecting a fault by means of each of test patterns separated into individual patterns by reset signals which initializes a sequential circuit mounted in LSI, identifying unnecessary test patterns, based on faults having been detected by the test patterns, and removing the unnecessary test patterns to reduce the number of test patterns.

Japanese Unexamined Patent Publication No. 7-191102 has suggested an apparatus for automatically generating a test pattern constituting a test pattern, used for testing a combinational circuit. The apparatus generates a first pattern with which a fault simulator conducts fault simulation. A pair of the first pattern and a fault which can be detected by the first pattern is input into a compacting unit. The first pattern is removed in the compacting unit to thereby compact the test pattern.

Japanese Unexamined Patent Publication No. 6-52005 has suggested a method of generating a test pattern used for testing a sequential circuit, including the steps of (a) connecting a first series to a second series to generate a pattern series which detects a specific transition fault where the first series accomplishes status transition from an initial condition in the status transition to a wrong status of destination, by means of status transition description, (b) generating an extended pattern series which extends other transition faults with values transmitted to a combinational circuit from a memory in each of patterns associated with each of status being in transition by means of the pattern series, being kept as they are, and (c) outputting the patterns to the combinational circuit in synchronization with clock signals, observing output signals transmitted from the combinational circuit, and inputting the extended patterns into the combinational circuit for observing the output signals with the clock signals being kept fixed.

Japanese Unexamined Patent Publication No. 11-83959 has suggested an apparatus for generating a test pattern, including first means for generating test patterns to detect a fault in circuit data, second means for removing a part of the circuit data influenced by test patterns generated by the first means, and third means for merging a test pattern generated by first means for the circuit data before its part is removed by second means, to a test pattern generated by first means for the circuit data after its part has been removed.

Japanese Patent No. 2953975 (Japanese Unexamined Patent Publication No. 8-212799) has suggested an apparatus for generating a test pattern used for testing a logic circuit, including first means for receiving connection data and fault data of a logic circuit, second means for making and outputting input data about a test pattern used for detecting a fault in the logic circuit, third means for assigning the test pattern input data to an input terminal of the logic circuit, fourth means for storing logical values of logic gates and input/output terminals of the logic circuit, based on the test pattern input data assigned to the input terminal, fifth means for defining fault data about a fault to be detected, sixth means for conducting fault simulation to all the faults identified by the fifth means, seventh means for extracting faults detected by the sixth means and removing the thus detected faults from target faults, eighth means for extracting an initial test pattern from all terminals acting as input terminals, based on the test pattern input data in which a fault was detected, ninth means for assigning a uncertain value to input terminals which are not necessary to have certain values, tenth means for storing the test patterns to which a uncertain value is assigned by the eighth means, eleventh means for checking whether faults to be detected exist in the fault data, transmitting an instruction of generating a test pattern, to the second means, if faults to be detected exist in the fault data, and transmitting an instruction of merging test patterns to one another, if faults to be detected do not exist in the fault data, twelfth means for merging the test patterns read out by the tenth means, to thereby generate a test pattern series, and thirteenth means for outputting the test pattern series merged by the twelfth means.

However, the above-mentioned problems remain unsolved even in the above-mentioned Publications.

SUMMARY OF THE INVENTION

In view of the above-mentioned problems in the prior art, it is an object of the present invention to provide a method of and an apparatus for generating a test pattern used for testing a logic circuit, both of which are capable of shortening a length of a test pattern generated by automatic test pattern generation systems used for a sequential circuit and a combinational circuit.

As mentioned later in detail, the present invention solves not only the problem accompanied with the first prior art, but also the problem accompanied with the second prior art to thereby provide a method of and an apparatus for generating a test pattern, both of which have a function of compacting a test pattern.

As mentioned earlier, the first prior art is accompanied with the problem that since the steps S2003 and S2006 can not be applied to a sequential circuit, a process of repeating the steps S2003 to S2006 for enhancing a function of compacting a test pattern can not be applied to a sequential circuit.

In accordance with the present invention, in order to solve the problem, steps corresponding to the steps S2004 and S2005 are repeatedly carried out while a test pattern is being generated, to accomplish dynamic compaction having a function of highly compacting a test pattern.

The method in accordance with the present invention is designed to include the step (corresponding the step S105 explained later in the embodiment) of re-activating a test pattern, in which the step (corresponding to the step S2005) of determining a uncertain value is first carried out, and then, the step (corresponding to the step S2004) of re-activating the uncertain value is carried out. The step of re-activating a test pattern is carried out while the steps corresponding to the steps S2004 and S2005 are being carried out. The step of re-activating a test pattern is introduced into the step of generating a test pattern, and may be carried out a plurality of times. As a result, test pattern compaction can be effectively carried out during the step of generating a test pattern. That is, the present invention accomplishes an enhanced function of dynamic compaction by applying the step of re-activating a test pattern to the step of generating a test pattern. In the step of generating a test pattern, a test pattern is generated to a fault to be detected, and there is generated a test sequence necessary for detecting the fault. Herein, a test sequence is defined as a sum of test patterns comprised of at least one test pattern having a positional relation among one another which relation is necessary for detecting a fault. By re-activating the test sequence a plurality of time in the step of re-activating a test pattern, it is possible to update a test sequence generated for detecting only one fault, into a test sequence capable of detecting one or more faults. The above-mentioned process may be applied to not only a sequential circuit, but also a combinational circuit.

In the above-mentioned second prior art, when a target fault can be detected by a plurality of test patterns, fault simulation is conducted to each of the test patterns, and a test pattern which detected faults most is selected as a test pattern to be used for the target fault. By combining this function with the solution to the above-mentioned problem in the first prior art, it would be possible to further enhance a function of test pattern compaction obtained by the solution to the problem accompanied with the first prior art, That is, the step (later mentioned step S105 in the embodiment) of re-activating a test pattern includes the step of determining a uncertain value, corresponding to the step S2005, and the step of re-activating a uncertain value, corresponding to the step S2004. The method in accordance with the present invention is designed to include, as an extended step of the step of re-activating a uncertain value, the steps of making copies of the test sequence having those uncertain value, and assigning a logical value "1" or "0" selected through pseudo-random number, to primary inputs having the uncertain value. As a result, there can be generated a plurality of test sequences each comprised of different test patterns. The thus generated test sequences are test sequences which can always detect a fault selected in the step of selecting a fault to be detected (later mentioned step S103 in the embodiment). Fault simulation is conducted to each of the test sequences in accordance with the test pattern compaction process disclosed in the second prior art, to find a test sequence which can detect faults most. Thus, the present invention makes it possible to detect a greater number of faults than the above-mentioned first and second prior art.

As is obvious in the problem accompanied with the second problem, since it takes much time to conduct fault simulation in accordance with the test pattern compaction disclosed in the second prior art, there may be used a parallel pattern parallel fault process in order to shorten a period of time for conducting fault simulation.

The above-mentioned parallel pattern parallel fault (PPPF) process is introduced in the following article, for instance: M. B. Amin and B. Vinakota, "ZAMBEZI: A Parallel Pattern Parallel Fault Sequential Circuit Fault Simulator", 1996 14th IEEE VLSI Test Symposium.

By using the PPPF simulation, it would be possible to concurrently conduct fault simulation to a plurality of faults, ensuring that fault simulation can be conducted at a high rate and the problem accompanied with the second prior art can be solved.

The later mentioned step S105 of re-activating a test pattern is comprised of a combination of the step S2004 extended by the PPPF simulation and the step S2005.

Hereinbelow is explained the PPPF simulation with reference to FIGS. 3A–3C, 4A–4C and 5A–5B. FIGS. 3A to 3C show the PPPF simulation, FIGS. 4A to 4C show the conventional fault simulation or SPPF simulation, and FIGS. 5A and 5B show the PPPF simulation.

Hereinbelow, fault definition illustrated in FIG. 3C is applied to a circuit 3101 illustrated in FIG. 3A, and fault simulation is conducted through the use of a test pattern set illustrated in FIG. 3B.

The circuit 3101 illustrated in FIG. 3A is comprised of a first external input terminal A, a second external input terminal B, an external output terminal D, a buffer device C1, and a 2-input AND gate C2 electrically connected to an output terminal of the buffer device C1.

In the fault definition, one degeneracy fault at the side of the first input terminal A of the 2-input AND gate C2 is defined as Fa1, and zero degeneracy fault at the side of the second input terminal B of the 2-input AND gate C2 is defined as Fb0.

The test pattern set illustrated in FIG. 3B includes a first test pattern T1 which applies a logical value "0" to the first external input terminal A and a logical value "1" to the second external input terminal B, and a second test pattern T2 which applies a logical value "1" to the first external input terminal A and a logical value "1" to the second external input terminal B.

In accordance with the conventional fault simulation, illustrated in FIGS. 4A to 4C, in which fault simulation is conducted to a plurality of faults through a plurality of test patterns, the fault simulation has to be conducted twice, that is, first fault simulation through the test pattern T1, illustrated in FIG. 4B, and second fault simulation through the test pattern T2, illustrated in FIG. 4C.

FIG. 4A shows a rule to indicate logical values. In the prior art, a logical value for a test pattern and logical values for the faults Fa1 and Fb0 are represented with two regions each having a 2-bit width. Assuming that one word is comprised of 32 words in a computer, it would be possible to deal with 32 different signals, because a logical value "1" or "0" of a certain signal can store 32 different logical values per one word. In the conventional fault simulation illustrated in FIGS. 4A to 4C, only two bits out of 32 bits are used for conducting fault simulation.

FIGS. 5A and 5B show the PPPF simulation in which a plurality of faults is simulated at a time through a plurality of test patterns. FIG. 5A shows a rule to indicate logical values. As shown in the rule, the first test pattern T1, the second test pattern T2, and logical values for the faults Fa1 and Fb0 can be represented with a 4-bit region, in the PPPF simulation. Hence, it would be possible to detect the faults Fa1 and Fb0 by conducting the fault simulation once, as illustrated in FIG. 5B showing the fault simulation to be conducted through the first and second test patterns T1 and T2.

As mentioned above, since the PPPF simulation illustrated in FIGS. 5A and 5B can use a capacity of representing logical values associated wit one word, as effectively as possible, the PPPF simulation can be conducted to a plurality of faults through a plurality of test patterns more rapidly than the conventional fault simulation illustrated in FIGS. 4A to 4C.

The conventional fault simulation illustrated in FIGS. 4A to 4C is called single pattern parallel fault (SPPF) simulation.

Specifically, in one aspect of the present invention, there is provided a method of generating a pattern for testing a logic circuit, including the steps of (a) judging whether generation of a test pattern is to be finished, (b) selecting a fault for which the test pattern is to be generated, if generation of the test pattern is judged to be continued in the step (a), (c) attempting generating at least one test pattern necessary for detecting the fault selected in the step (b), and (d) carrying out fault simulation to find a test pattern by which undetected faults are detected most, among copies of the at least one test pattern, and re-activating the thus found test pattern, if the at least one test pattern is generated in the step (c).

For instance, the step (d) may be comprised of the steps of (d1) identifying a fault which can be detected by means of at least one test pattern, among undetected faults, (d2) identifying external input terminals which are not necessary for detecting a fault, among external input terminals each constituting at least one test pattern, (d3) applying uncertain values to the external input terminals having been identified in the step (d2), (d4) making L copies of the at least one test pattern wherein L is an integer equal to or greater than 2, (d5) applying a first or second logical value to uncertain values in each of the copied test patterns such that the copied test patterns are different from one another, (d6) carrying out fault simulation to undetected faults through the use of the at least one test pattern, and (d7) finding a test pattern by which undetected faults are detected most, among L copies of the at least one test pattern, the thus found test pattern being re-activated in the step (d).

The step (d6) may include the step of sampling one undetected fault out of M undetected faults to select the undetected faults, in which case, the fault simulation to be carried out in the step (d6) is preferably parallel pattern parallel fault (PPPF) fault simulation.

The step (d6) may include the step of carrying out single pattern parallel fault (SPPF) fault simulation to all of undetected faults.

It is preferable that the method further includes the steps of (e) judging whether the step (d) have been carried out N times wherein N is an integer equal to or greater than 1, and (t) carrying out fault simulation to undetected faults having not been detected, if the step (d) have been carried out N times.

It is preferable that the method further includes the step of repeating the step (d), if the step (d) have not been carried out N times.

It is preferable that the method further includes the step of outputting the test pattern having been re-activated in the step (d), to an external memory.

For instance, generation of a test pattern is finished or not in the step (a) in accordance whether at least one of a fault detecting rate, the number of test patterns, a period of time necessary for generating a test pattern, and the number of undetected faults meets a desired condition.

For instance, generation of a test pattern is finished, if at least one of following conditions is realized: (A) a fault detecting rate is equal to or greater than a desired fault detecting rate, (B) the number of test patterns is equal to or greater than the desired number of test patterns, (C) a period of time necessary for generating a test pattern is equal to or longer than the desired period of time necessary for doing the same, and (D) the number of undetected faults is equal to zero.

It is preferable that the method further includes the step of receiving circuit data and fault data both necessary for generating a test pattern, from an external memory.

It is preferable that the method further includes the step of transmitting data about all generated test patterns and data about all corrected faults to an external memory, if generation of a test pattern is judged to be finished in the step (a).

It is preferable that the method further includes the step of repeating the step (a), if the at least one test pattern is not generated in the step (c).

It is preferable that the method further includes the step of selecting the first or second logical value through pseudo-random number.

There is further provided a method of generating a pattern for testing a logic circuit, including the steps of (a) judging whether generation of a test pattern is to be finished, (b) receiving at least one test pattern from an external memory, if generation of the test pattern is judged to be continued in the step (a), (c) checking whether a fault is detected in all test patterns having been received in the step (b), if a circuit to be tested is a combinational circuit, and (d) carrying out fault simulation to find a test pattern by which undetected faults are detected most, among copies of the at least one test pattern, and re-activating the thus found test pattern, if the fault is detected in the step (c).

It is preferable that the method further includes the step of abandoning the all test patterns, if the fault is not detected, and repeating the step (a).

There is further provided a method of generating a pattern for testing a logic circuit, including the steps of (a) judging whether generation of a test pattern is to be finished, (b)

receiving at least one test pattern from an external memory, if generation of the test pattern is judged to be continued in the step (a), (c) generating at least one test pattern, based on a test pattern which detects a fault, if a circuit to be tested is a sequential circuit, and (d) carrying out fault simulation to find a test pattern by which undetected faults are detected most, among copies of the at least one test pattern, and re-activating the thus found test pattern.

The method may further include the step of storing a test pattern which does not detect a fault, in a memory, and repeating the step (a) when a test pattern which detects a fault is input into the memory.

It is preferable that the at least one test pattern in generated in the step (c), based on the test pattern which detects a fault, in combination with the test pattern stored in the memory.

In another aspect of the present invention, there is provided an apparatus for generating a pattern for testing a logic circuit, including (a) a judge which judges whether generation of a test pattern is to be finished, (b) a selector which selects a fault for which the test pattern is to be generated, if generation of the test pattern is judged to be continued in the step (a), (c) a pattern generator which attempts generating at least one test pattern necessary for detecting the fault selected by the selector, and (d) a simulator which carries out fault simulation to find a test pattern by which undetected faults are detected most, among copies of the at least one test pattern, and re-activates the thus found test pattern, if the at least one test pattern is generated by the pattern generator.

For instance, the fault simulator may be comprised of (d1) a first identifier which identifies a fault which can be detected by means of at least one test pattern, among undetected faults, (d2) a second identifier which identifies external input terminals which are not necessary for detecting a fault, among external input terminals each constituting at least one test pattern, (d3) a first device which applies uncertain values to the external input terminals having been identified by the second identifier, (d4) a copier which makes L copies of the at least one test pattern wherein L is an integer equal to or greater than 2, (d5) a second device which applies a first or second logical value to uncertain values in each of the copied test patterns such that the copied test patterns are different from one another, (d6) a fault simulator which carries out fault simulation to undetected faults through the use of the at least one test pattern, and (d7) a detector which finds a test pattern by which undetected faults are detected most, among L copies of the at least one test pattern, the thus found test pattern being re-activated by the simulator.

It is preferable that the fault simulator includes a sampler for sampling one undetected fault out of M undetected faults to select the undetected faults.

It is preferable that fault simulator carries out parallel pattern parallel fault (PPPF) fault simulation to the undetected faults.

It is preferable that the fault simulator carries out single pattern parallel fault (SPPF) fault simulation to all of undetected faults.

The apparatus may further include (e) a judge which judges whether the simulator have carried out re-activation of the test pattern N times wherein N is an integer equal to or greater than 1, and (f) a simulator which carries out fault simulation to undetected faults having not been detected, if the simulator have carried out the re-activation N times.

The apparatus may further include a device which outputs the test pattern having been re-activated, to an external memory.

It is preferable that the judge judges whether generation of a test pattern is to be finished in accordance whether at least one of a fault detecting rate, the number of test patterns, a period of time necessary for generating a test pattern, and the number of undetected faults meets a desired condition.

For instance, generation of a test pattern is finished, if at least one of following conditions is realized: (A) a fault detecting rate is equal to or greater than a desired fault detecting rate, (B) the number of test patterns is equal to or greater than the desired number of test patterns, (C) a period of time necessary for generating a test pattern is equal to or longer than the desired period of time necessary for doing the same, and (D) the number of undetected faults is equal to zero.

The apparatus may further include a receiver which receives circuit data and fault data both necessary for generating a test pattern, from an external memory.

The apparatus may further include a device which transmits data about all generated test patterns and data about all corrected faults to an external memory, if generation of a test pattern is judged to be finished.

It is preferable that the second device selects the first or second logical value through pseudo-random number.

There is further provided an apparatus for generating a pattern for testing a logic circuit, including (a) a judge which judges whether generation of a test pattern is to be finished, (b) a receiver which receives at least one test pattern from an external memory, if generation of the test pattern is judged to be continued by the judge, (c) a checker which checks whether a fault is detected in all test patterns having been received by the receiver, if a circuit to be tested is a combinational circuit, and (d) a simulator which carries out fault simulation to find a test pattern by which undetected faults are detected most, among copies of the at least one test pattern, and re-activates the thus found test pattern, if the fault is detected by the checker.

There is still further provided an apparatus for generating a pattern for testing a logic circuit, including (a) a judge which judges whether generation of a test pattern is to be finished, (b) a receiver which receives at least one test pattern from an external memory, if generation of the test pattern is judged to be continued by the judge, (c) a pattern generator which generates at least one test pattern, based on a test pattern which detects a fault, if a circuit to be tested is a sequential circuit, and (d) a simulator which carries out fault simulation to find a test pattern by which undetected faults are detected most, among copies of the at least one test pattern, and re-activates the thus found test pattern.

The apparatus may further include a memory which stores a test pattern which does not detect a fault, and wherein the judge judges whether generation of a test pattern is to be finished, when a test pattern which detects a fault is input into the memory.

It is preferable that the pattern generator generates the at least one test pattern, based on the test pattern which detects a fault, in combination with the test pattern stored in the memory.

The advantages obtained by the aforementioned present invention will be described hereinbelow.

As explained in the later mentioned first embodiment, the first advantage is that a function of compacting test patterns, obtained by repeating the step of re-activating a test pattern, during the step of generating a test pattern, and a function of compacting test patterns, obtained by identifying a test pattern which detects undetected fault most among a plurality of test patterns used in the repeating step, can be compatible at a high rate by using the PPPF simulation. As a result, it would be possible to enhance both of the functions, and provide the dynamic compaction process having an enhanced function of test pattern compaction.

As explained in the later mentioned second embodiment, the second advantage is that the present invention can be applied not only to dynamic compaction, but also static compaction, if slight modification were made.

The above and other objects and advantageous features of the present invention will be made apparent from the following description made with reference to the accompanying drawings, in which like reference characters designate the same or similar parts throughout the drawings.

BRIEF DESCRIPTION OF THE DRAWINGS

FIG. 2 is a flow chart showing steps to be carried out in the test pattern compaction disclosed in the second prior art.

FIG. 3A is a circuit diagram of a circuit used for explaining PPPF simulation.

FIG. 3B illustrates an example of test patterns used in PPPF simulation.

FIG. 3C shows an example of fault definition.

FIG. 8A illustrates an example of test patterns used in the first embodiment.

FIGS. 8B to 8E are circuit diagrams of a circuit used for explaining the step of determining a uncertain value, to be carried out in the first embodiment.

FIG. 8F shows an example of fault definition in the first embodiment.

FIG. 9 is a block diagram for explaining both the step of copying and re-activating test patterns, and the PPPF simulation.

DESCRIPTION OF THE PREFERRED EMBODIMENTS

Preferred embodiments in accordance with the present invention will be explained hereinbelow with reference to drawings.

First Embodiment

Figure 6:
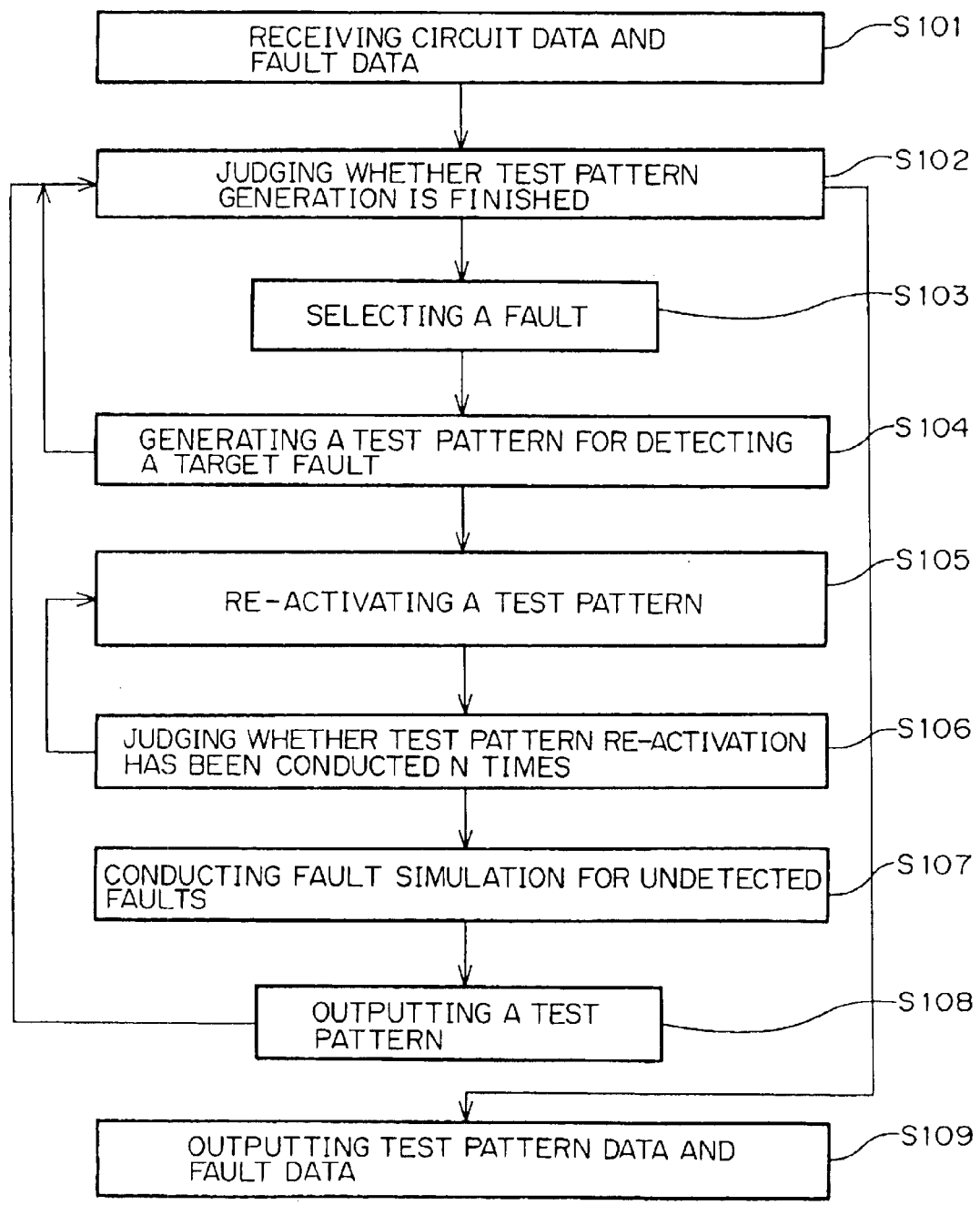
FIG. 6 is a flow chart showing steps to be carried out in the method in accordance with the first embodiment of the present invention.

FIG. 6 is a flow chart showing steps to be carried out in the method of generating test patterns used for testing a logic circuit, in accordance with the first embodiment.

The method of generating test patterns used for testing a logic circuit, in accordance with the first embodiment includes the steps of receiving circuit data and fault data (S101), judging whether generation of a test pattern is to be finished (S102), selecting a fault to be detected (S103), generating a test pattern for detecting a target fault (S104), re-activating a test pattern (S105), judging whether re-activation of a test pattern has been conducted N times (S106), conducting fault simulation for undetected faults (S107), outputting a test pattern (S108), and outputting test pattern data and fault data (S109).

In the step S101, circuit data and fault data both necessary for generating a test pattern are input from an external memory (not illustrated).

In the step S102, it is judged whether generation of a test pattern is to be finished, based on judgment about whether a fault detecting rate, the number of test patterns, a period of time necessary for generating a test pattern, and the number of undetected faults meet predetermined conditions. If generation of a test pattern is judged to be finished, the step S109 is carried out. In contrast, if generation of a test pattern is judged to be continued, the step S103 is carried out, In the step S103, a fault for which a test pattern is generated is selected.

In the step S104, an attempt is made to generate one or more test pattern(s) necessary for detecting the fault having been selected in the step S103. If such one or more test pattern(s) cannot be generated, the step S102 is carried out. If such one or more test pattern(s) can be generated, the step S105 is carried out.

The step S105 or the step of re-activating a test pattern includes the sub-steps of identifying a fault which can be detected by means of at least one test pattern, among undetected faults, identifying external input terminals which are not necessary for detecting a fault, among external input terminals each constituting at least one test pattern, applying uncertain values to the thus identified external input terminals, making L copies of the at least one test pattern wherein L is an integer equal to or greater than 2, applying a logical value "0" or "1" to uncertain values in each of the copied test patterns through the use of pseudo-random numbers such that the copied test patterns are different from one another carrying out fault simulation to undetected faults selected by sampling one undetected fault out of M undetected faults, through the use of the at least one test pattern, in accordance with the PPPF simulation, finding a test pattern by which undetected faults are detected most, among L copies of the at least one test pattern, selecting the thus found test pattern as the test pattern selected in the step S103, and re-activating the test pattern generated in the step S104 as a test pattern which can detect faults by the greater number.

In the step S106, it is judged whether the step S105 has been carried out N times wherein N is an integer equal to or greater than 1. If the step S105 has been carried out N times, the step S107 is carried out. If the step S105 has not been carried out N times, the step S105 is repeatedly carried out.

In the step S107, fault simulation is conducted to faults which have not been detected in the step S105.

In the step S108, the test pattern or test patterns having been re-activated in the step S105 is(are) output to an external memory (not illustrated).

In the step S109, data about all the generated test patterns and data about faults having been dealt with are output to an external memory (not illustrated).

Figure 7:
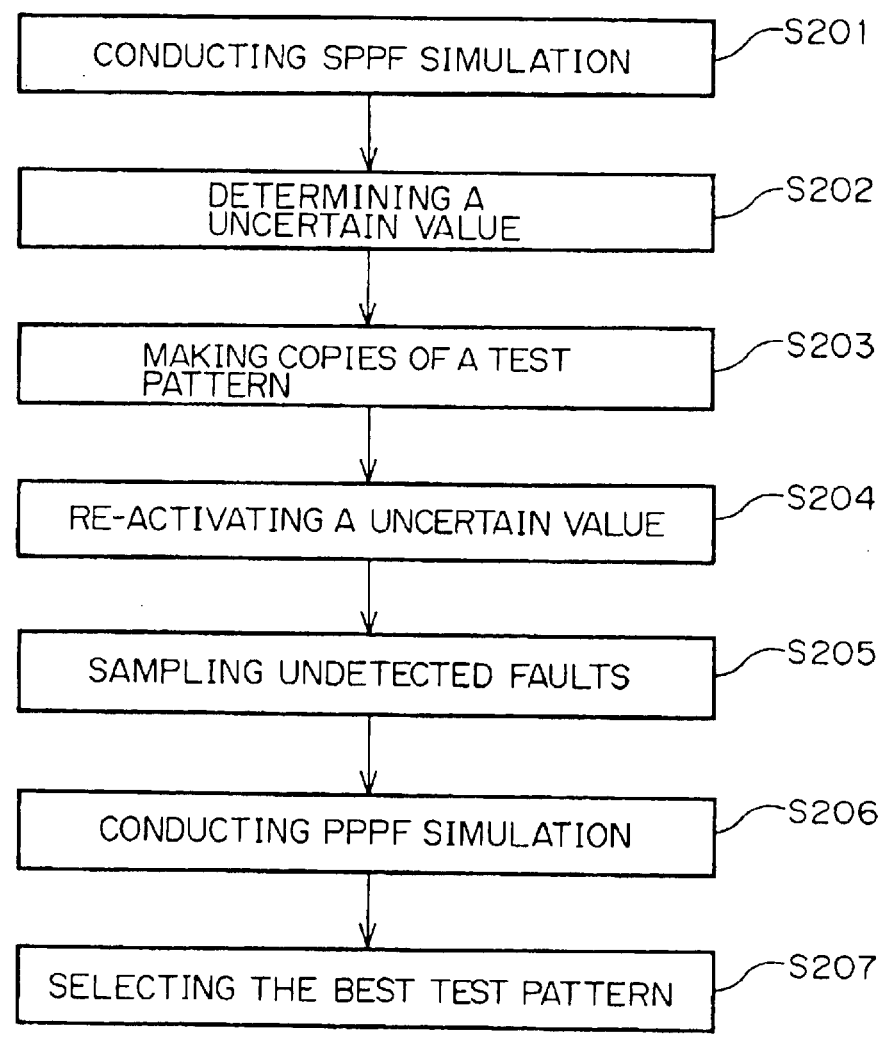
FIG. 7 is a flow chart of the step of re-activating a test pattern, to be carried out in the first embodiment.

The first embodiment is characterized by the step S105 or step of re-activating a test pattern. FIG. 7 is a flow chart showing sub-steps to be carried out in the step S105. Hereinbelow is explained the step S105 in detail with reference to FIG. 7.

With reference to FIG. 7, the step S105 is comprised of the sub-steps of conducting SPPF simulation (S201), determining a uncertain value (S202), making copies of a test pattern (S203), re-activating a uncertain value (S204), sampling undetected faults (S205), conducting PPPF simulation, and selecting the best test pattern (S207).

In the step S201, fault simulation is conducted to all of undetected faults through the use of one or more test patterns.

In the step S202, external input terminals which are not necessary for detecting a fault having been detected in the step S201 is extracted among external input terminals each constituting one or more test pattern(s), and a uncertain value is applied to the thus extracted external input terminal.

In the step S203, L copies of the test pattern to which a uncertain value has been assigned are made, wherein L is an integer equal to or greater than 2.

In the step S204, a logical value "0" or "1" is applied to uncertain values in each of the copied test patterns. The logical value "0" or "1" is selected in accordance with pseudo-random numbers.

In the step S205, undetected faults are sampled at a rate of one undetected fault out of M undetected faults.

In the step S206, fault simulation is conducted to the thus sampled undetected faults through the use of the L copied test patterns in accordance with the PPPF simulation.

In the step S207, a test pattern by which the undetected faults are detected most among L copies of the test patterns to which the fault simulation was conducted in the step S206, is selected as the best test pattern.

Hereinbelow the sub-steps constituting the step S105 are explained in detail with reference to FIGS. 8A to 8F, 9 and 10.

Figure 1:
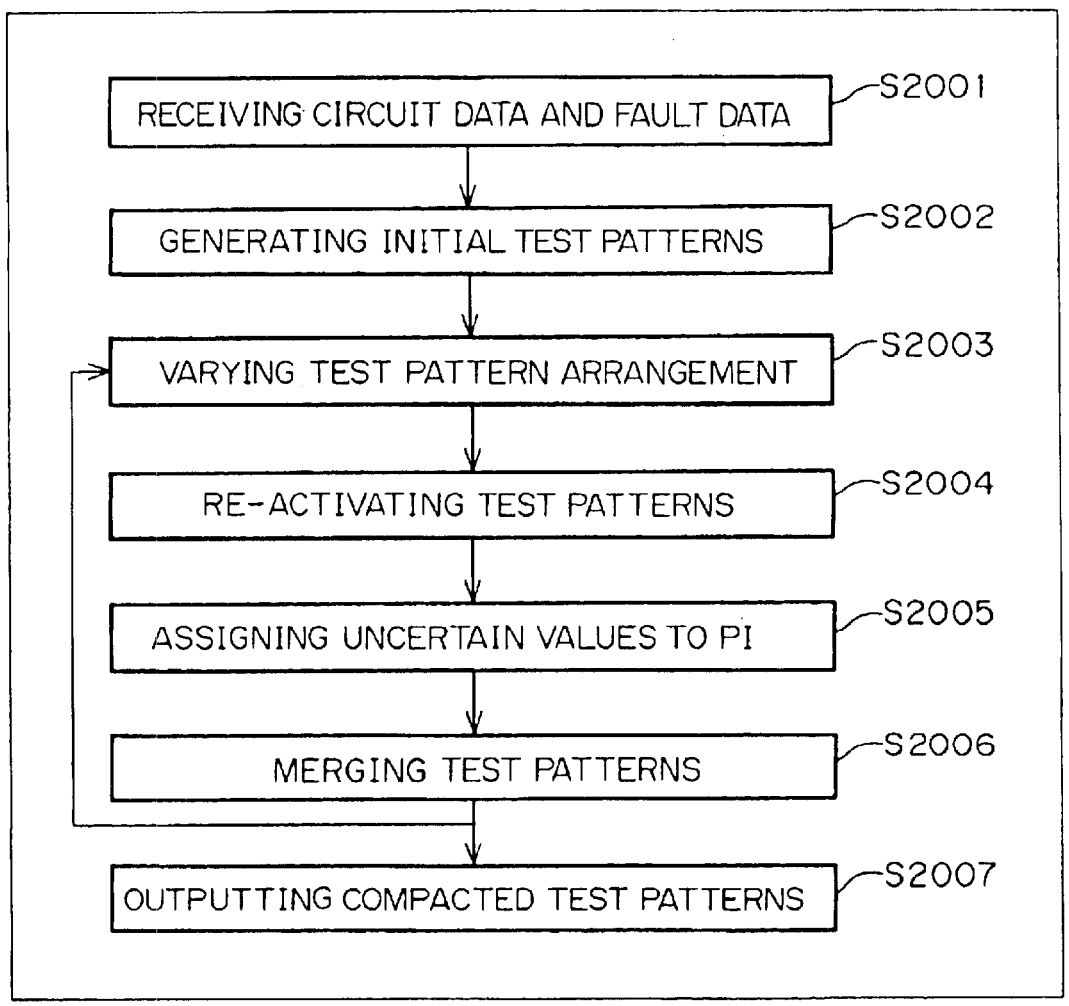
FIG. 1 is a flow chart showing steps to be carried out in the test pattern compaction disclosed in the first prior art.
Figure 4C:
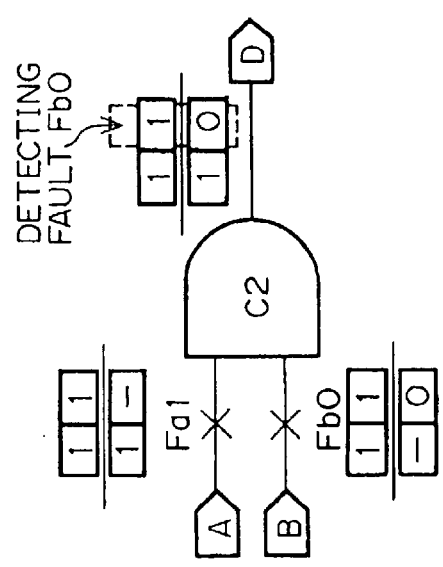
FIG. 4C is a circuit diagram of a circuit used for explaining the conventional fault simulation or SPPF simulation.
Figure 4B:
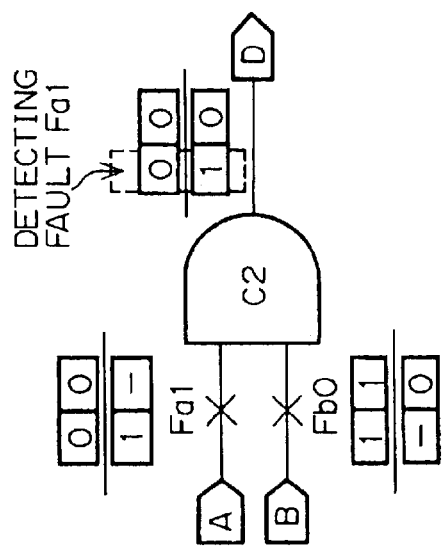
FIG. 4B is a circuit diagram of a circuit used for explaining the conventional fault simulation or SPPF simulation.
Figure 4A:
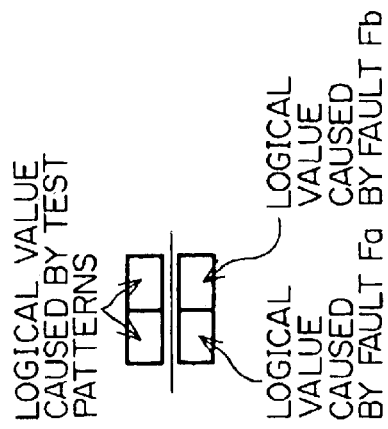
FIG. 4A shows a rule to indicate logical values in the conventional fault simulation or SPPF simulation.

The step S201 or step of conducting SPPF simulation has such a data structure as illustrated in FIG. 4A, and can simulate a plurality of faults at a time when fault simulation is conducted to a test pattern.

The step S202 has the same structure as the step suggested in the above-mentioned Japanese Unexamined Patent Publication No. 8-212799. Specifically, in the step S202, a uncertain value is applied to an external output terminal which is not logically relevant to detection of a fault having been detected by one or more test pattern(s).

For instance, when faults F0 and F1 defined in the fault definition shown in FIG. 8F are to be detected in a combinational circuit illustrated in FIG. 8B, a logical value "1" of the external output terminal A of the first test pattern T1 illustrated in FIG. 8A is not necessary for detecting both the faults F0 and F1. Hence, a uncertain value can be applied to the external input terminal A of the first test pattern T1, as illustrated in FIGS. 8B and 8C.

When the faults F0 and F1 are to be detected in a sequential circuit illustrated in FIG. 8D, a logical value "1" of the external output terminal A of the second test pattern T2 illustrated in FIG. 8A is not necessary for detecting both the faults F0 and F1. Hence, a uncertain value can be applied to the external input terminal A of the second test pattern T2, as illustrated in FIGS. 8D and 8E.

Hereinbelow is explained how the test pattern to which a uncertain value is applied in the step S202 is processed in the steps S203 and S204, with reference to FIG. 9.

Figure 10:
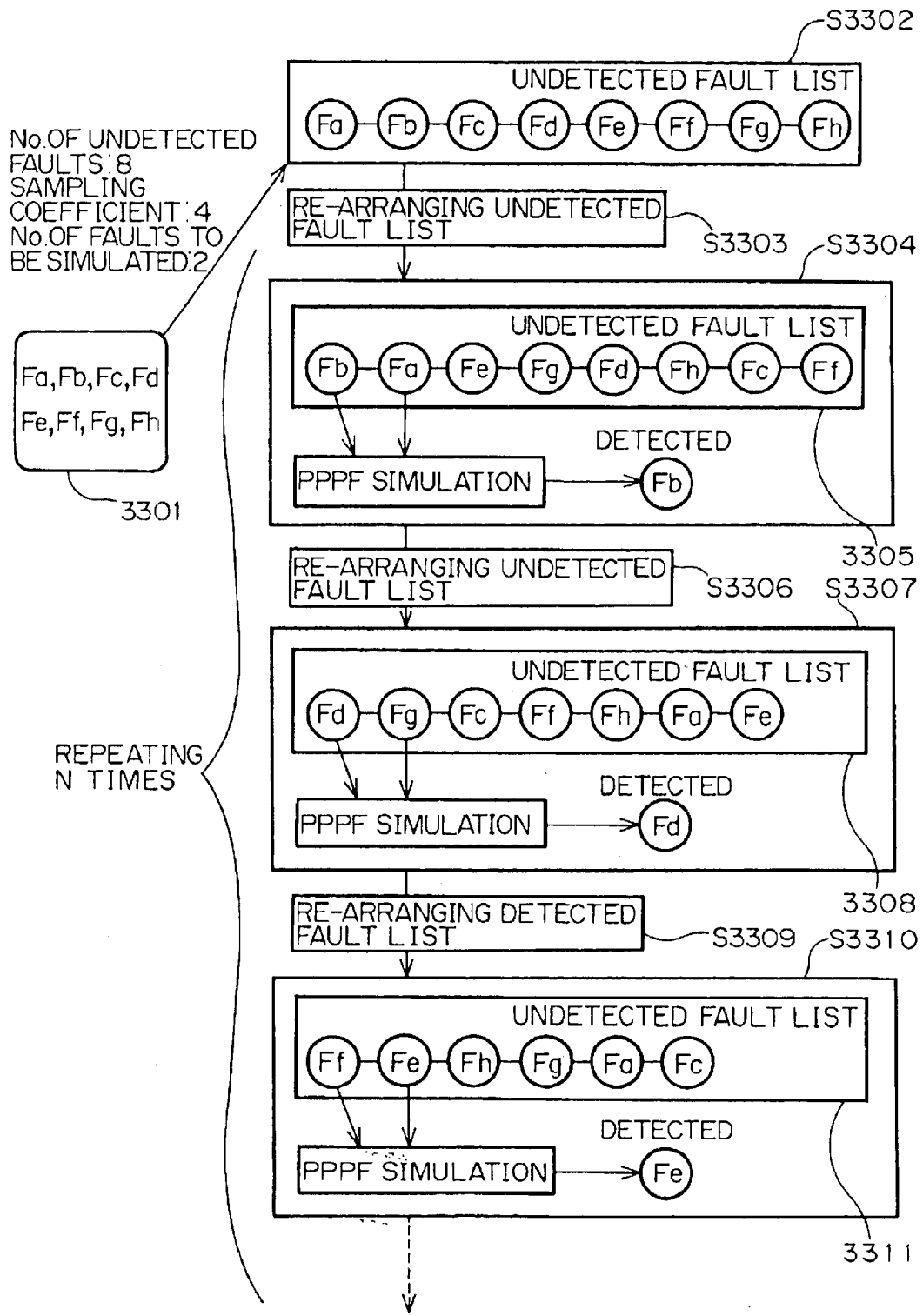
FIG. 10 is a block diagram of the step of sampling undetected faults, to be carried out in the first embodiment.

FIG. 9 is a block diagram for explaining both the step of copying and re-activating test patterns, and the PPPF simulation, and FIG. 10 is a block diagram of the step of sampling undetected faults.

With reference to FIG. 9, L copies of a test pattern 3201 to which a uncertain value has been applied in the step S202 are made in the step S203. Thus copied test patterns constitute a copied test pattern group 3202.

The copied test pattern group 3202 is re-activated and thus converted into a re-activated test pattern group 3203 in the step S204 in accordance with sampling fault data 3207 input thereinto.

The step S205 is repeatedly carried out each time the step S105 is repeatedly carried out.

In the step S205, undetected faults are sampled such that the same fault is not continuously sampled. For instance, as illustrated in FIG. 10, assuming that a undetected fault group 3301 is listed on a undetected fault list 3302, the undetected fault list 3302 is re-arranged such that new arrangement is different from arrangement made at the previous sampling, in the step S3303 of re-arranging the undetected fault list through the use of pseudo-random numbers. In the thus re-arranged undetected fault list 3305, 1/N of the total number of undetected faults are selected starting from a first one in the re-arranged undetected fault list 3305. The thus selected undetected faults are treated as sampled undetected faults.

For instance, assuming that the total number of undetected faults is 8 and a sampling fault coefficient M is 4, two undetected faults (8/4=2), that is, faults Fb and Fa are selected as sampled undetected faults.

The PPPF simulation is conducted to the thus selected undetected faults.

When the fault Fb is detected in the first PPPF simulation (step S3304), the fault Fb is removed from the undetected fault list 3305. Accordingly, in the second PPPF simulation (step S3307), the fault Fb no longer exists in an undetected fault list 3308 obtained by re-arranging the undetected fault list 3305 through the use of pseudo-random numbers in the step S3306.

Similarly, when the fault Fd is detected in the second PPPF simulation (step S3307), the fault Fd is removed from the undetected fault list 3308. Accordingly, in the third PPPF simulation (step S3310), the fault Fd no longer exists in an undetected fault list 3311 obtained by re-arranging the undetected fault list 3308 through the use of pseudo-random numbers in the step S3309.

Hereinafter, the same steps as mentioned above are repeated N times.

Figure 5B:
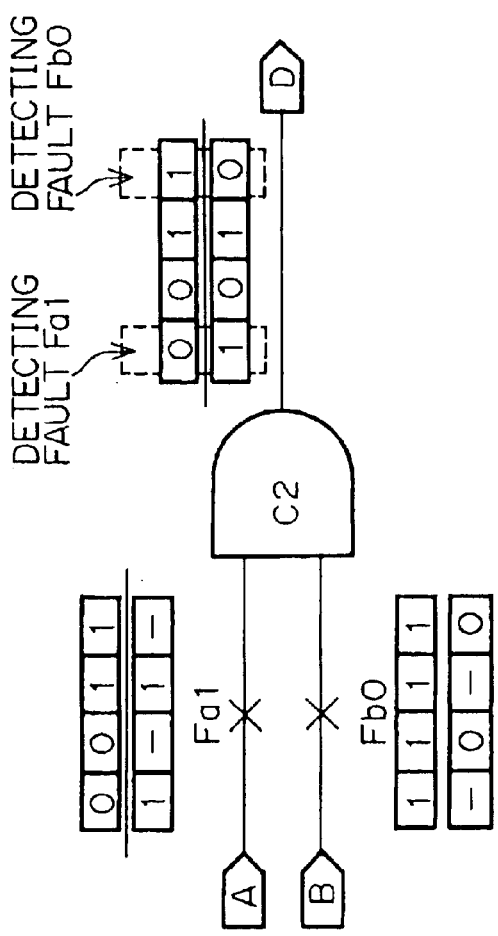
FIG. 5B is a circuit diagram of a circuit used for explaining the PPPF simulation.
Figure 5A:
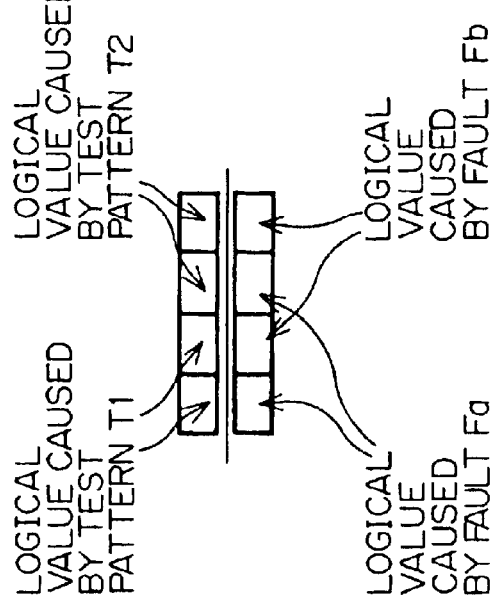
FIG. 5A shows a rule to indicate logical values in the PPPF simulation.

The step S206 or step of conducting PPPF simulation has such a data structure as illustrated in FIG. 5A, and can simulate a plurality of faults at a time through the use of a plurality of test patterns such as the first and second test patterns T1 and T2.

In the step S207, as illustrated in FIG. 9, the PPPF simulation is conducted to the re-activated test pattern group 3203, and then, the number 3205 of faults having been detected in each of the re-activated test patterns is calculated. Then, a re-activated test pattern 3206 which detected the faults most is selected as a best test pattern.

Figure 11:
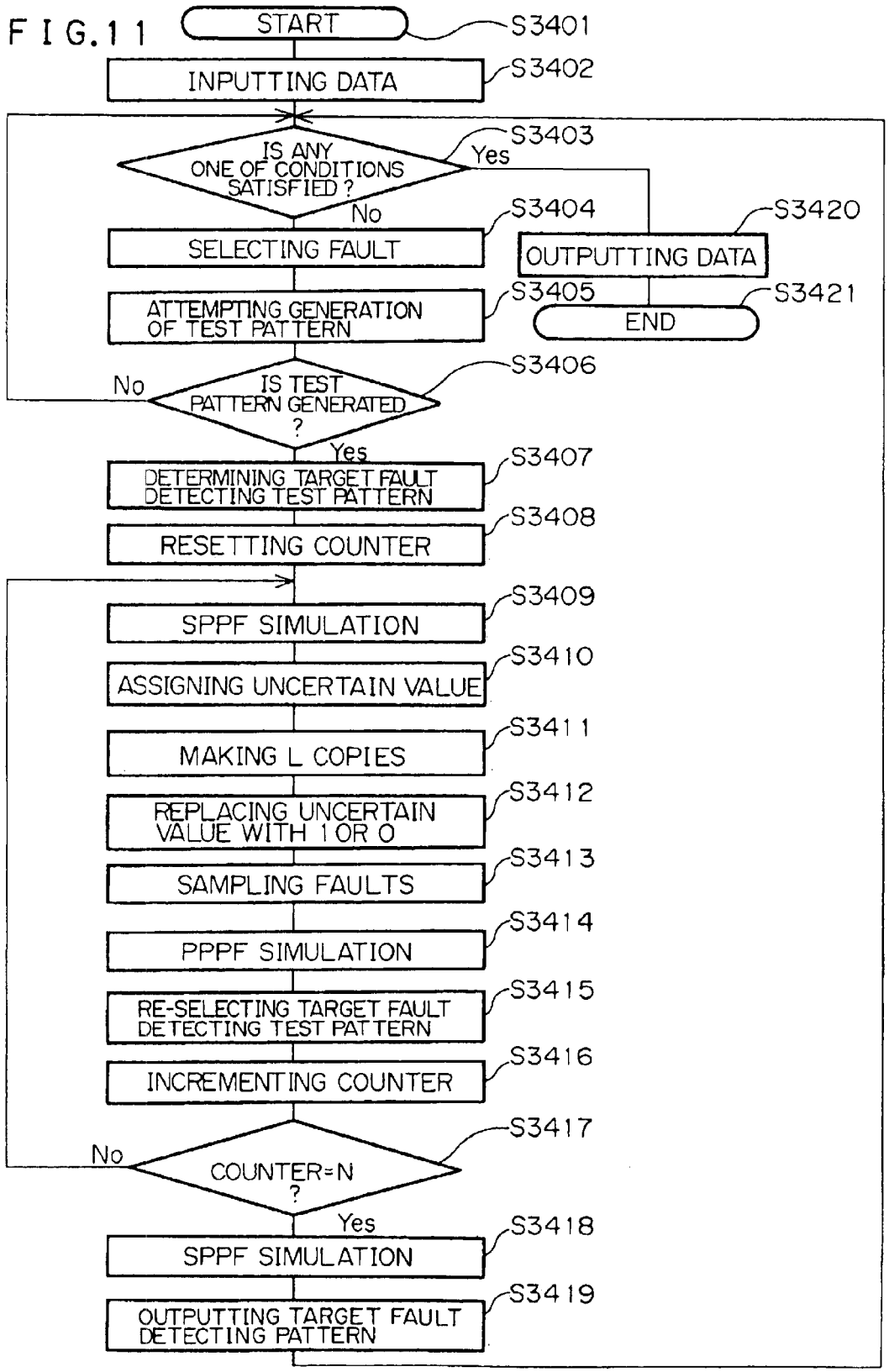
FIG. 11 is a flow chart showing steps to be carried out in the first embodiment.

FIG. 11 is a flow chart showing steps to be carried out in the method in accordance with the first embodiment. Hereinbelow is explained each steps in the method.

With reference to FIG. 11, the method starts at the step S3401.

Then, data about connection of a logic circuit end data about fault both necessary for generating a test pattern are received from an external memory, in the step S3402.

Then, it is checked as to whether conditions for finishing generation of a test pattern are satisfied, in the step S3403. If at least one of the following conditions is realized, conditions for finishing generation of a test pattern are judged to be satisfied.

1. A fault detecting rate is equal to or greater than a desired fault detecting rate.

Herein, a fault detecting rate is defined as a ratio of the number of detected faults to the effective total number of faults. The effective total number of faults is defined as a difference between the number of total faults input in the step S3402 and the number of faults which are proved not to be able to generate a test pattern capable of detecting the fault.

2. The number of test patterns generated is equal to or greater than the desired number of test patterns.

3. A period of time necessary for generating a test pattern is equal to or longer than the desired period of time necessary for doing the same.

4. The number of undetected faults is equal to zero.

If any one of the above-mentioned conditions is realized (YES in the step S3403), the step S3420 is carried out, whereas if none of the above-mentioned conditions is realized (NO in the step S3403), the step S3404 is carried out.

Then, there are selected undetected faults for which a test pattern is to be generated, in the step S3404.

Then, an attempt is made in the step S3405 to generate a test pattern for detecting the fault having been selected in the step S3403.

However, it is not always possible to generate a test pattern for detecting the fault having been selected in the step S3403. For instance, if the selected fault is a redundancy fault exerting no influence on an external output terminal of a logic circuit, it is impossible to generate a test pattern capable of detecting the redundancy fault. Specifically, since one degeneracy fault defined at a voltage source terminal exerts no influence on a logic circuit, it is impossible to generate a test pattern which can detect the fault.

Then, it is judged in the step S3406 whether a test pattern can be generated in the step S3405.

If a test pattern was not generated (NO in the step S3406), the step S3403 is repeatedly carried out.

If a test pattern was generated (YES in the step S3406), the test pattern having been generated in the step S3405 is determined as a test pattern used for detecting the fault having been selected in the step S3404, in the step S3407. The thus determined test pattern will be compacted in later mentioned step S3408 and subsequent steps. Hereinafter, the thus determined test pattern is referred to as a target fault detecting test pattern.

Then, a counter indicating how many times the PPPF simulation was conducted is reset to zero, in the step S3408.

Then, the SPPF simulation is conducted to all of the undetected faults through the use of the target fault detecting test pattern, in the step S3409.

Then, a uncertain value is applied to an external input terminal which is not necessary for detecting the fault having been able to be detected in the step S3409, among external input terminals constituting the target fault detecting test pattern, in the step S3410.

Then, L copies of the target fault detecting test pattern to which an uncertain value has been assigned are made, in the step S3411.

Then, the uncertain values in the L copies of the target fault detecting test pattern are replaced with a logical value "1" or "0" through the use of pseudo-random numbers, in the step S3412.

Then, undetected faults which can be dealt with by means of the PPPF simulation are sampled by the number R at most among all of undetected faults, in the step S3413. Herein, the number R is defined as a quotient obtained by dividing the number of undetected faults at the time the step S3408 is carried out, by the sampling fault coefficient M.

Then, there is conducted the PPPF fault simulation by means of the L test patterns having been prepared in the step S3412 and the faults having been sampled in the step S3413, in the step S3414.

Then, it is checked as to which test pattern detected the undetected faults most, and the test pattern which detected the undetected faults most is newly determined as a target fault detecting test pattern.

Then, the counter for counting how many times the PPPF simulation is carried out is counted up by one, in the step S3416.

Then, it is checked whether the counter indicates N, in the step S3417.

If the counter does not indicate N (NO in the step S3417), the step S3409 and subsequent steps are repeatedly carried out.

If the counter indicates N (YES in the step S3417), the SPPF simulation is conducted to all of the undetected faults through the use of the target fault detecting test pattern, in the step S3418, to thereby detect all detectable faults having been not detected so far.

If a logic circuit is comprised of a sequential circuit, an internal state in each of circuits in which any faults cannot be detected is updated.

Then, the target fault detecting test pattern is output to an external memory (not illustrated), in the step S3419.

If any one of the above-mentioned conditions is realized (YES in the step S3403), final data indicative of the number of the test patterns and data about detection of faults are output to an external memory (not illustrated), in the step S3420.

Thus, the method in accordance with the first embodiment ends (step S3421).

Figure 12:
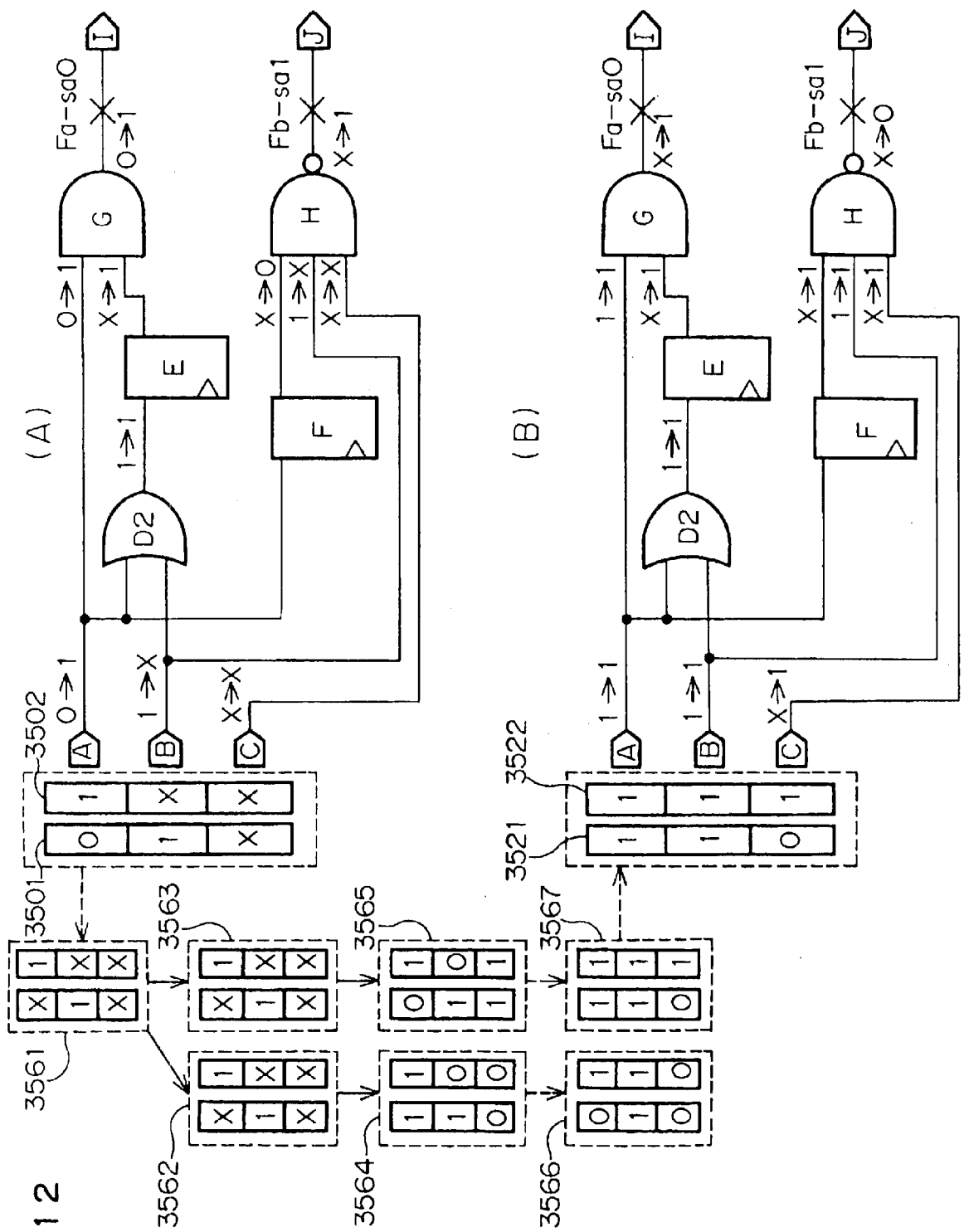
FIG. 12 is a block diagram of an example of an apparatus of generating a test pattern used for a logic circuit in the first embodiment.

FIG. 12 is a block diagram of both an example of an apparatus of generating a test pattern for reducing the method in accordance with the first embodiment into practice, and an example of an apparatus of generating a test pattern for reducing the second prior art into practice.

Hereinbelow is explained an example of the above-mentioned first embodiment with reference to FIGS. 11 and 12.

As illustrated in FIG. 12, the apparatus of generating a test pattern is comprised of a first external input terminal A, a second external input terminal B, a third external input terminal C, an OR gate D2, a first flip-flop circuit E, a second flip-flop circuit F, a two-input AND gate G, a NAND gate H, a first external output terminal I, and a second external output terminal J.

The OR gate D2 has two inputs one of which is electrically connected to the first input terminal A, and the other is electrically connected to the second input terminal B, and has an output electrically connected to the first flip-flop circuit E.

The AND gate G has two inputs one of which is electrically connected to the first input terminal A, and the other is electrically connected to the first flip-flop circuit E, and has an output electrically connected to the first external output terminal I.

The NAND gate H has three inputs electrically connected to the second flip-flop circuit F, the second external input terminal B and the third external E input terminal C, and has an output electrically connected to the second external output terminal J.

The first flip-flop circuit E is electrically connected between the OR gate D2 and the AND gate G, and the second flip-flop circuit F is electrically connected between the NAND gate H and the first input terminal A.

First, the method in accordance with the first embodiment starts at step S3401.

The conditions for finishing generation of a test pattern, to be judged in the step S3403, are as follows.

Fault detecting rate=100%

Number of test patterns to be generated=1000

Period of time for generating a test pattern=No limitation

Number of undetected faults=0

If at least one of the above-mentioned conditions is satisfied while a test pattern is being generated, generation of a test pattern is finished at that time.

Parameters used in the present example are determined as follows.

Number L of copy of a test pattern: L=2

Sampling fault coefficient M: M=2

Number N of repetition of PPPF simulation: N=2

Data about the apparatus fault Fa-sa0, and fault Fb-sa1 are received from an external memory (not illustrated), in the step S3402.

The apparatus illustrated in FIG. 12 defines a monophasic synchronization type sequential circuit in which the first and second flip-flop circuits E and F receive the same clock signals at their clock terminals. In FIG. 12, clock lines are omitted. It is assumed that the fault Fa-sa0 is a zero degeneracy fault by which an output terminal of the two-input AND gate G is short-circuited to ground, and the fault Fb-sa1 is one degeneracy fault by which an output terminal of the NAND gate H is short-circuited to a power source.

Then, it is judged whether any one of the above-mentioned conditions for finishing generation of a test pattern is satisfied, in the step S3403.

Since none of the conditions is satisfied at this stage (NO in the step S3403), a fault for which a test pattern is generated is selected, in the step S3404. Herein, the fault Fa-sa0 is selected.

Then, there is generated a test pattern for detecting the fault Fa-sa0, in the step S3405. Thus, it is assumed that test patterns 3501 and 3502 are generated as the test pattern for detecting the fault Fa-sa0.

Then, it is judged as to whether a test pattern for detecting the fault Fa-sa0 could be generated, in the step S3406.

Since the test patterns 3501 and 3502 were generated in the step S3405 (YES in the step S3406), the step S3407 is carried out. In the step S3407, the test patterns 3501 and 3502 having been generated in the step S3405 are determined as test patterns for detecting a target fault (hereinafter, referred to as "target fault detecting test pattern"). The test patterns 3501 and 3402 determined as the target fault detecting test patterns will be compacted in subsequent steps.

A counter for counting how many times PPPF simulation is conducted is reset to zero, in the step S3408.

Then, there is conducted the SPPF simulation to assign uncertain values to the test patterns 3501 and 3502, in the step S3409. As a result, only the fault Fa-sa0 is detected.

Since a uncertain value "0" at the first output input terminal A in the test pattern 3501 is not necessary for detecting the fault Fa-sa0, a uncertain value "X" is assigned to the first output input terminal A in the test pattern 3501, in the step S3410. Hereinbelow, the test pattern 3501 to which the uncertain value "X" has been assigned and the test pattern 3502 are referred to as a target fault detecting test pattern set 3561.

Then, two copies of the target fault detecting test pattern set 3561 are made, in the step S3411. Hereinbelow, thus copied target fault detecting test pattern sets are referred to as test pattern sets 3562 and 3563.

Then, random numbers different from each other are assigned to uncertain values of the test pattern sets 3562 and 3563 to thereby convert the test pattern sets 3562 and 3563 into reactivated test pattern sets 3564 and 3565, respectively, in the step S3412. The random numbers are selected through pseudo-random numbers, for instance.

Then, sample faults are sampled out of the undetected faults, in the step S3413. At this stage, faults which are not detected by fault simulation are the faults Fa-sa0 and Eb-sa1. In this embodiment, the fault Fa-sa0 is selected as a sample fault among those two faults.

Then, the PPPF simulation is conducted in the step S3414. As a result, the fault Fa-sa0 together with the re-activated test pattern sets 3564 and 3565 is detected. Accordingly, the number of fault detection becomes 1 in both of the re-activated test pattern sets 3564 and 3565. Hence, either one of the re-activated test pattern sets 3564 and 3565 may be selected as a test pattern which detected faults most. In this embodiment, the re-activated test pattern set 3564 is selected as a test pattern which detected faults most.

Then, the re-activated test pattern set 3564 selected in the step S3414 as a test pattern which detected faults most is determined again as a target fault detecting test pattern set, in the step S3415.

Then, the counter for counting how many times the PPPF simulation was conducted is set to indicate 1, in the step S3416.

Then, it is judged whether the counter indicates 2, in the step S3417. However, since the counter indicates 1 at this stage (NO in the step S3417), the step 3409 and subsequent steps are repeatedly carried out.

In the step S3409, the SPPF simulation is conducted to all of the undetected faults, that is, the faults Fa-sa0 and Fb-sa1, through the use of the re-activated test pattern set 3564 which has been newly determined as a target fault detecting test pattern set. As a result, only the fault Fa-sa0 is detected.

Then, the uncertain value "X" is assigned to an external input terminal which is not necessary to detect the fault Fa-sa0 having been detected in the step S3409. As a result, there is obtained the test pattern set 3561 again.

Then, two copies of the test pattern set 3561 are made in the step S3411. The thus copied test pattern sets are referred to as the test pattern sets B562 and 3563.

Then, random numbers different from each other are assigned to uncertain values of the test pattern sets 3562 and 3563 to thereby convert the test pattern sets 3562 and 3563 into re-activated test pattern sets 3566 and 3567, respectively, in the step S3412. The random numbers are selected through pseudo-random numbers, for instance.

Then, sample faults are sampled out of the undetected faults, in the step S3413. At this stage, faults which are not detected by fault simulation are the faults Fa-sa0 and Fb-sa1. Herein, the fault Fb-sa1 is selected as a sample fault among those two faults.

Then, the PPPF simulation is conducted in the step S3414. As a result, only the re-activated test pattern set 3567 detects the fault Fb-sa1. Accordingly, the number of fault detection becomes 0 in of the re-activated test pattern set 3566, and the number of fault detection becomes 1 in of the re-activated test pattern set 3567. Hence, the re-activated test pattern set 3567 is selected as a test pattern which detected faults most.

By conducting the fault simulation through the use of the test patterns 3521 and 3522, as illustrated in FIG. 12-(B), both the faults Fa-sa0 and Fb-sa1 can be detected.

Then, the test patterns 3521 and 3522 are determined as a target fault detecting test pattern set, in the step S3415.

Then, the counter for counting how many times the PPPF simulation was conducted is incremented by one, in the step S3416. As a result, the counter indicates 2.

Then, it is judged whether the counter indicates 2, in the step S3417. Since the counter indicates 2 at this stage (YES in the step S3417), the step S3418 is carried out.

In the step S3418, the SPPF simulation is conducted to all of the undetected faults, in which case, both of the faults Fa-sa0 and Fb-sa1 are detected. However, if undetected faults exist, internal states of circuits in which the undetected faults exist are updated in accordance with the simulation results.

Then, the target fault detecting test patterns, that is, the test patterns 3521 and 3522 are output to an external memory (not illustrated), in the step S3419.

Then, as illustrated in FIG. 12-(B), the step S3403 is carried out again, that is, it is judged as to whether any one of the conditions for finishing generation of a test pattern is satisfied. At this stage, since all the faults have been already detected, the undetected faults no longer exist. That is, the above-mentioned condition 4 is satisfied. Since any one of the conditions is satisfied (YES in the step S3403), the step S3420 is carried out.

In the step S3420, data indicative of the number of test patterns and data about faults having been detected are output to an external memory (not illustrated).

Thus, the method finishes at the step S3421.

Figure 13:
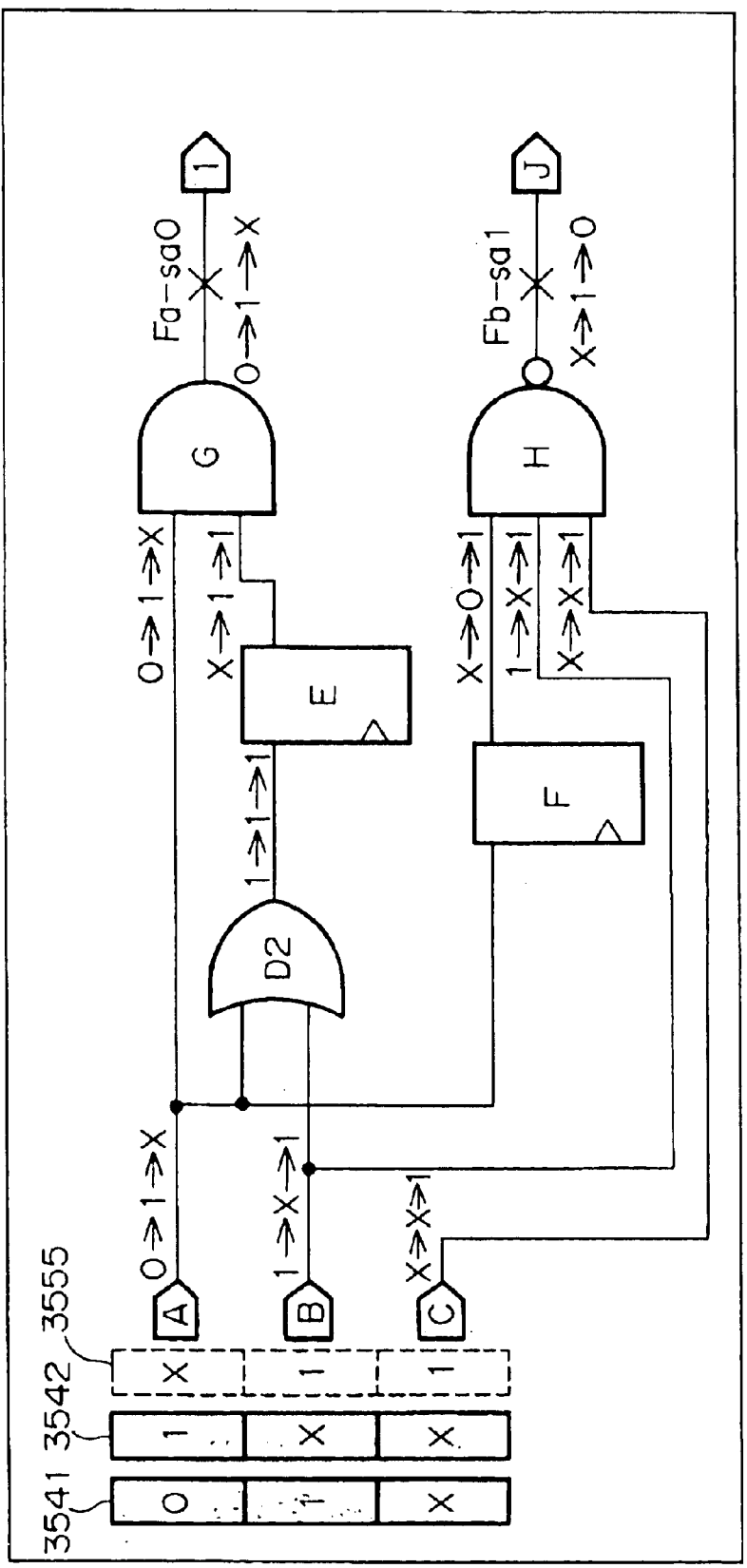
FIG. 13 is a block diagram of an example of an apparatus of generating a test pattern used for a logic circuit in the second prior art.

Hereinbelow is explained how a test pattern is generated in accordance with the second prior art, with reference to FIGS. 13 and 2. FIG. 13 is a circuit diagram of a circuit for reducing the second prior art into practice.

In the circuit, the fault list is made in the step S2102, and then, it is judged whether all the faults have been detected, in the step S2103. At this stage, neither of the faults Fa-sa0 nor Fb0-sa1 are detected (NO in the step S2103), the step S2104 is carried out.

In the step S2104, the fault Fa-sa0 is assumed as a target fault.

Then, it is judged whether the target fault has been already detected, in the step S2105. Since the target fault Fa-sa0 is not detected yet at this stage (NO in the step S2105), the step S2106 is carried out.

In the step S2106, it is assumed that test patterns 3541 and 3542 are generated as test patterns which detect the target fault Fa-sa0. The test patterns 3541 and 3542 are identical with the test patterns 3501 and 3502 having been explained in the first embodiment.

Then, it is checked as to whether the generated test pattern is single or not, in the step S2107.

Since eight combinations of the test patterns are obtained for detecting the target fault Fa-sa0 (YES in the step S2107), the step S2109 is carried out.

The eight combinations are as follows.

[(Test pattern 3541: A, B, C), (Test pattern 3542: A, B, C)]=

(1) [(0, 1, 0), (1, 0, 0)],
(2) [(0, 1, 1), (1, 0, 1)],
(3) [(0, 1, 0), (1, 1, 0)],
(4) [(0, 1, 1), (1, 1, 0)],
(5) [(0, 1, 0), (1, 0, 1)],
(6) [(0, 1, 1), (1, 0, 1)],
(7) [(0, 1, 0), (1, 1, 1)], or
(8) [(0, 1, 1), (1, 1, 1)].

In the step S2109, it is checked as to whether a plurality of test patterns is selected among the test patterns, that is, it is checked as to whether fault simulation was conducted to the above-mentioned eight test patterns. At this stage, fault simulation is conducted through the use of none of the eight test patterns (NO in the step S2107). Hence, the step S2110 is carried out.

Then, the steps S2110, S2111 and S2109 are carried out in a loop. However, even if fault simulation is conducted to all of the faults Fa-sa0 and Fb-sa1 through the use of all the test pattern combinations, the fault Fb-sa1 could not be detected. The reason is as follows. Since the first external input terminal A of the test pattern 3541 has a logical value of "0", the second flip-flop circuit F absolutely has a logical value of "0", when the test pattern 3542 is applied thereto after having applied the test pattern 3541 and thereafter a clock signal thereto. As a result, it would be impossible to set an output transmitted from the NAND gate H to be zero, and hence, even if fault simulation is conducted to the eight test patterns which can be tested with the test patterns 3541 and 3542, it would be impossible to detect the fault Fb-sa1.

Then, a test pattern which detected faults most is selected as a test pattern for the target fault, in the step S2112. In the step S2112, since the number of detected faults in all of the eight test patterns is one, that is, the eight test patterns have only the fault Fa-sa0, any one of the test patterns may be selected.

Then, the fault list is updated in the step S2113.

Thereafter, the step S2103 is repeated. That is, it is checked as to whether all faults are detected. Since the fault Fb-sa1 is not detected yet at this stage (NO in the step S2103), the step S2104 is carried out.

The fault Fb-sa1 is determined as a target fault, in the step S2104.

Then, it is checked as to whether the test patterns having been generated so far have detected the target fault, in the step S2105.

Since the target fault Fb-sa1 is not detected yet (NO in the step S2105), the step S2106 is carried out. That is, a test pattern 3555 for detecting the target fault is generated, in the step S2106.

Thereafter, similarly to the previously mentioned case, after the steps S2107, S2109, S2110, S2111, S2112 and S2113 have been carried out, the step S2103 is repeatedly carried out. Since undetected faults no longer exist at this stage, the second prior art finished at the step S2114.

The number of test patterns to be generated in the second prior art is three (3). In contrast, the number of test patterns to be generated in the above-mentioned first embodiment is two (2). That is, the first embodiment can detect a target fault through the smaller number of test patterns than the second prior art.

As having been explained so far, in accordance with the first embodiment, a function of compacting test patterns, obtained by repeating the step of re-activating a test pattern, during the step of generating a test pattern, and a function of compacting test patterns, obtained by identifying a test pattern which detects undetected fault most among a plurality of test patterns used in the repeating step, can be compatible at a high rate by using the PPPF simulation. As a result, it would be possible to enhance both of the functions, and provide the dynamic compaction process having an enhanced function of test pattern compaction.

An example of the advantages obtained by the first embodiment is shown in Tables 1 and 2.

TABLE 1

| | W1 | W2 | W3 | Parameters |
|---|---|---|---|---|
| Second Prior Art | 1514 | 7004 | 56.8 | L = 1, N = 32, M = 1, Re-activation is not conducted |
| First Embodiment | 956 | 4583 | 64.3 | L = 4, N = 8, M = 1, Re-activation is conducted |

TABLE 2

| | W4 | W5 | W6 |
|---|---|---|---|
| Second Prior Art | 100.00% | 100.00% | 100.00% |
| First Embodiment | 63.14% | 65.43% | 113.20% |

In Table 1, W1 indicates the number of test patterns, W2 indicates a period of time necessary for generating a test pattern in the unit of seconds, and W3 indicates the number of bits occupied in a memory in the unit of megabits (MB). In Table 2, W4 indicates the number of test patterns in the unit of percent, W5 indicates a period of time necessary for generating a test pattern in the unit of percent, and W6 indicates the number of bits occupied in a memory in the unit of percent.

Figure 14:
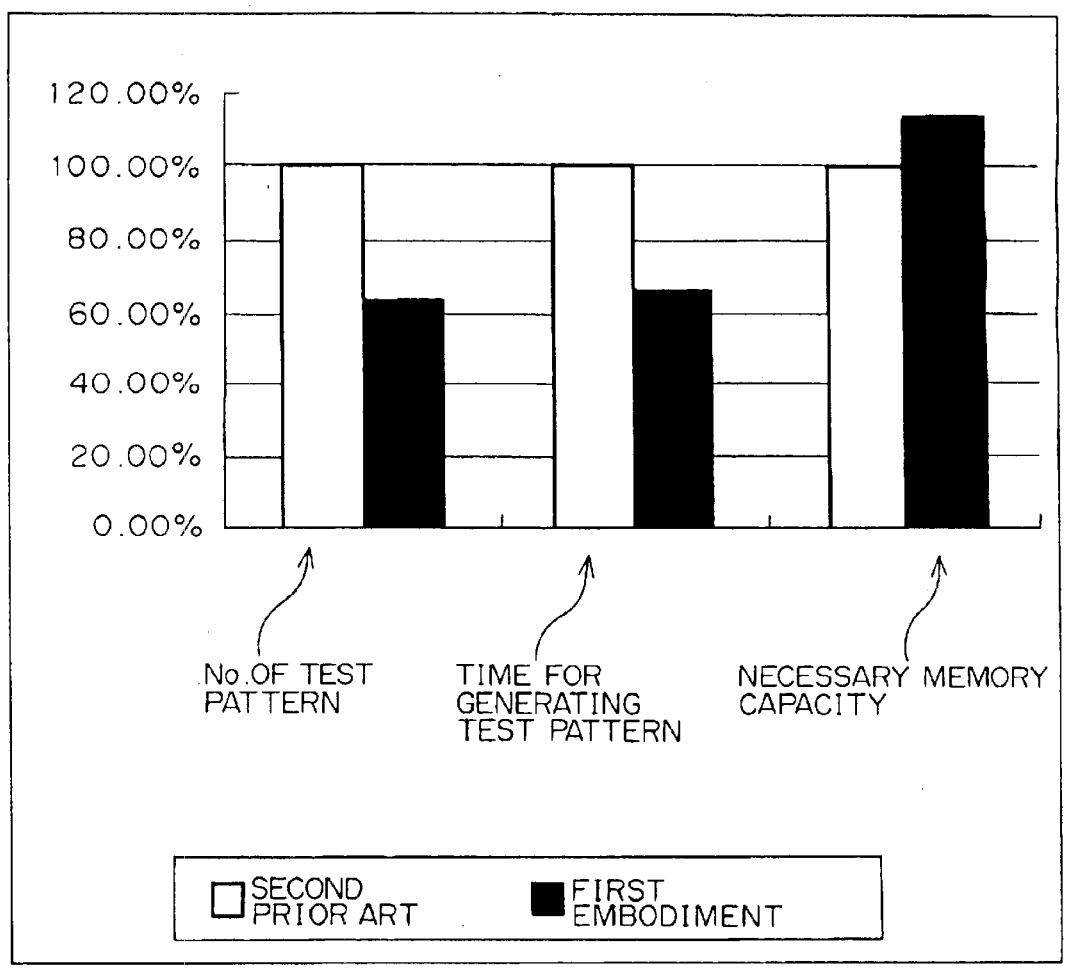
FIG. 14 is a graph showing the advantages obtained by the first embodiment.

FIG. 14 shows the comparison between the second prior art and the first embodiment, shown in Table 2.

Tables 1 and 2 indicates evaluation to a sequential circuit having a scale of tens of kilogates.

Data shown in the row named "Second Prior Art" in Tables 1 and 2 were obtained by adjusting the parameters used in the first embodiment. That is, the parameters were changed as follows.

The number of copies of a test pattern=1
The number of repetition to conduct PPPF simulation=32
Fault sampling coefficient=1
Target=All of undetected faults In addition, an uncertain value was not assigned to a test pattern, and a test pattern was not re-activated in the second prior art.

In the first embodiment, when a test pattern was not re-activated, a test pattern which detected faults most in repetition of the necessary steps remained, which means that the first embodiment entirely covers the second prior art. The parameters in the first embodiment were determined as follows.

The number of copies of a test pattern=4
The number of repetition to conduct PPPF simulation=8
Fault sampling coefficient=1

In contrast with the second prior art, an uncertain value was assigned to a test pattern, and was re-activated in the first embodiment. The number of test patterns to be tested were set equal to 32 in both the first embodiment and the second prior art.

As is obvious in view of Tables 1 and 2, the first embodiment improves both the number of test patterns and a period of time necessary for generating a test pattern, by about 30% to 40% in comparison with the second prior art.

Second Embodiment

Figure 15:
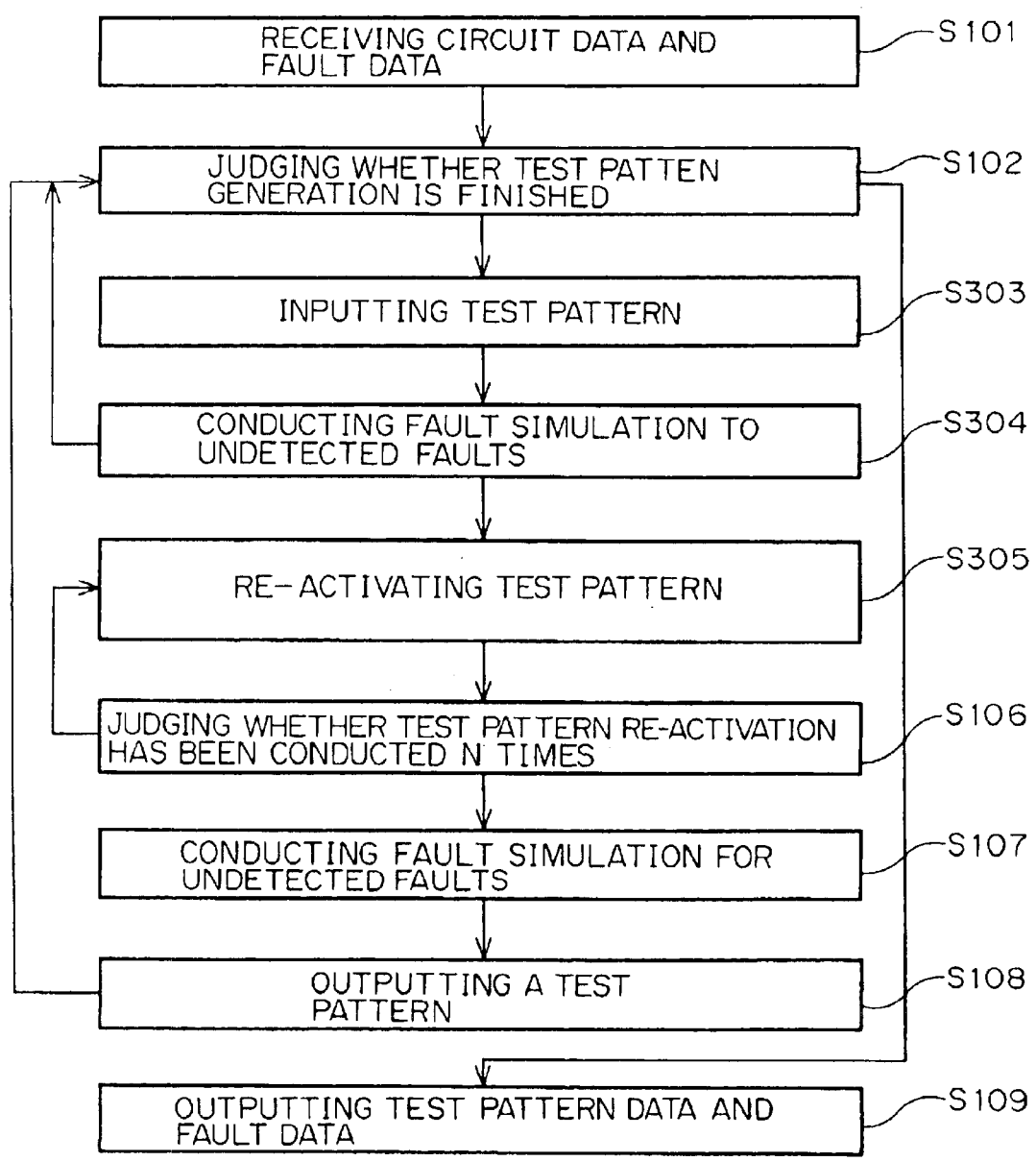
FIG. 15 is a flow chart showing steps to be carried out in the method in accordance with the second embodiment of the present invention.

FIG. 15 is a flow chart to be carried out in the method of generating a test pattern, in accordance with the second embodiment. Steps that correspond to those of the first embodiment in FIG. 6 have been provided with the same reference numerals.

Hereinbelow is explained the method in accordance with the second embodiment, with reference to FIG. 15. Whereas the present invention is applied to the dynamic compaction process in the first embodiment, the present invention is applied to the static compaction process in the second embodiment.

The method of generating test patterns used for testing a logic circuit, in accordance with the second embodiment includes the steps of receiving circuit data and fault data (S101), judging whether generation of a test pattern is to be finished (S102), inputting a test pattern (S303), conducting fault simulation to undetected faults (S304), re-activating a test pattern (S305), judging whether re-activation of a test pattern has been conducted N times (S106), conducting fault simulation for undetected faults (S107), outputting a test pattern (S108), and outputting test pattern data and fault data (S109).

Specifically, the method in accordance with the second embodiment is structurally different from the method in accordance with the first embodiment in including the steps S303, S304 and S305 in place of the steps S103, S104 and S105.

In the static compaction process to which the present invention is applied in the second embodiment, a test pattern for detecting a fault is in advance generated. Hence, after carrying out the steps S101 and S102, test patterns are input from an external memory (not illustrated) one by one, in the step S303.

Different sub-steps are carried out in the step S304 in accordance with whether a circuit to be tested is a combinational circuit or a sequential circuit.

First, it is assumed that a circuit to be tested is a combinational circuit.

If no faults are detected with respect to all of the test patterns having been input in the step S303, those test patterns are abandoned, and then, the step S102 is carried out. If faults are detected, those test patterns are re-activated in the step S305.

Second, it is assumed that a circuit to be tested is a sequential circuit.

A test pattern with which a fault is not detected is temporarily stored in a memory, and the step S102 is carried out when a test pattern with which a fault is detected has been input. If the input test pattern detects a fault, the input test pattern is re-activated in the step S305. If a test pattern is temporarily stored in the memory, the test pattern together with the above-mentioned input test pattern is re-activated in the step S305.

The step S305 or the step of re-activating a test pattern includes the sub-steps of identifying a fault which can be detected by means of at least one test pattern, among undetected faults, identifying external input terminals which are not necessary for detecting a fault, among external input terminals each constituting at least one test pattern, applying uncertain values to the thus identified external input terminals, making L copies of the at least one test pattern wherein L is an integer equal to or greater than 2, applying a logical value "0" or "1" to uncertain values in each of the copied test patterns through the use of pseudo-random numbers such that the copied test patterns are different from one another, carrying out fault simulation to undetected faults selected by sampling one undetected fault out of M undetected faults, through the use of the copy or copies of the at least one test pattern, in accordance with the PPPF simulation, selecting a copy or copies of the at least one test pattern which detects undetected faults most, among L copies of the at least one test pattern, as the test pattern selected in the step 8304, and re-activating the test pattern simulated in the step S304 as a test pattern which can detect faults by the greater number.

Then, the steps S106, S107, S108 and S109 are carried out in the same manner as the first embodiment.

Figure 16:
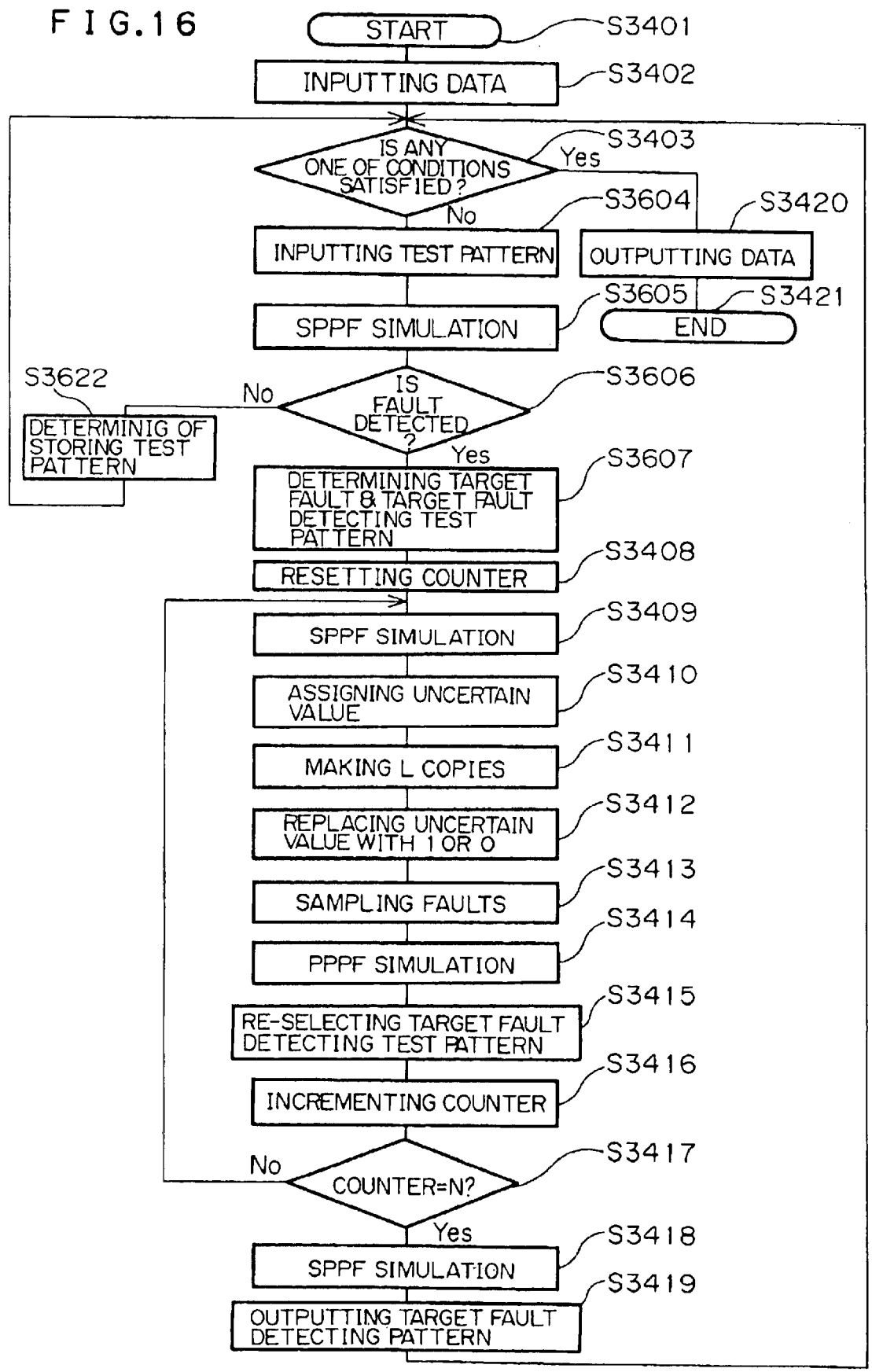
FIG. 16 is a flow chart showing steps to be carried out in the second embodiment.

FIG. 16 is a flow chart showing steps to be carried out in the method in accordance with the second embodiment. Hereinbelow is explained the method in accordance with the second embodiment, with reference to FIG. 16. The steps that correspond to the steps in the method in accordance with the first embodiment, illustrated in FIG. 11, have been provided with the same reference numerals, As shown in FIG. 16, the method in accordance with the second embodiment is structurally different from the method in accordance with the first embodiment only in that whereas a test pattern is generated during the method in accordance with the first embodiment is being carried out, a test pattern is input from an external memory, for instance, before the method accordance with the second embodiment starts or during the method in accordance with the second embodiment is being carried out.

Specifically, the step S3404 or step of selecting a fault for which a test pattern is to be generated is replaced with the step S3604 or step of receiving a test pattern from an external memory, the step S3405 or step of generating a test pattern for detecting a fault is replaced with the step S3605 or step of conducting SPPF simulation for detecting undetected faults, the step S3406 or step of judging whether a test pattern was generated is replaced with the step S3606 or step of judging whether a fault was able to be detected, and the step S3407 or step of determining a test pattern for detecting a target fault is replaced with the step S3607 or step of determining both a target fault and a test pattern used for detecting a target fault.

In the step S3604, one test pattern is input from an external memory (not illustrated).

In step S3605, the SPPF simulation is conducted to undetected faults through the use of the thus input test pattern.

In step S3606, it is judged whether the test pattern having been input in the step S3604 could detect a fault. If the test pattern is judged to have been able to detect a fault (YES in the step S3606), the step S3607 is carried out. If the test pattern is judged not to have been able to detect a fault (NO in the step S3606), the step S3622 is carried out. The step S3622 is not included in the steps to be carried out in the method in accordance with the first embodiment, illustrated in FIG. 11.

In the step S3607, the fault having been detected in the step S3605 is determined as a target fault, and a test pattern or test patterns which detect(s) the target fault is(are) determined as a target fault detecting test pattern.

If a circuit to be tested is a sequential circuit and the memory temporarily stores a test pattern in the step S3622, the test pattern stored in the memory and the test patterns which detected faults are determined as a target fault detecting test pattern. Herein, one or more test pattern(s) such as the test pattern stored in the memory and the test patterns which detected faults constitute(s) a test pattern sequence.

If a circuit to be tested is a combinational circuit, the test pattern having been input in the step S3604 is abandoned, in the step S3622. In contrast, if a circuit to be tested is a sequential circuit, the test pattern having been input in the step S3604 is temporarily stored in a memory, in the step S3622.

Then, the subsequent steps S3408 to S3421 are carried out in the same way as the first embodiment.

The second embodiment provides not only the advantages obtained by the above-mentioned first embodiment, but also the advantage that the present invention can be applied to the static compaction process by slightly modifying the first embodiment.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 2000-277651 filed on Sep. 13, 2000 including specification, claims, drawings and summary is incorporated herein by reference in its entirety.

What is claimed is:

1. A method of generating a pattern for testing a logic circuit, said method comprising:

judging whether generation of a test pattern is to be undertaken;

if it is judged that generation of a test pattern is to be undertaken, identifying, from among undetected, faults, faults which can be detected by at least one test pattern;

selecting from the identified faults a fault for which a test pattern is to be generated;

attempting to generate at least one test pattern for detecting the selected fault;

from among external input terminals, each being part of at least one test pattern, identifying external input terminals which are not necessary for detecting the selected fault;

applying undefined values to the identified external input terminals;

making L copies of the at least one test pattern, where L is an integer equal to or greater than 2;

applying a first logical value or a second logical value to the undefined values in each of the copies of the at least one test pattern such that the copies of the at least one test pattern are different from one another;

carrying out fault simulation of undetected faults through the use of the at least one test pattern;

among the L copies of the at least one test pattern, finding a test pattern by which the most undetected faults are detected; and re-activating the found test pattern, if at least one test pattern has been generated.

2. The method as set forth in claim 1, wherein selecting a fault includes sampling at a rate of one undetected fault out of M undetected faults to select the undetected faults.

3. The method as set forth in claim 2, wherein carrying out fault simulation comprises carrying out parallel pattern parallel fault (PPPF) fault simulation.

4. The method as set forth in claim 1, wherein carrying out fault simulation comprises carrying out single pattern parallel fault (SPPF) simulation of all undetected faults.

5. The method as set forth in claim 1, further comprising:
judging whether fault simulation has been carried out N times, where N is an integer equal to or greater than 1; and
carrying out fault simulation of undetected faults that have not been detected, if fault simulation has been carried out N times.

6. The method as set forth in claim 5, further comprising: carrying out fault simulation if fault simulation has not been carried out N times.

7. The method as set forth in claim 1, further comprising outputting the found test pattern to an external storage unit.

8. The method as set forth in claim 1, wherein said judging whether generation of a test pattern is to be undertaken is based on whether at least one of a fault detecting rate, the number of test patterns, a period of time necessary for generating a test pattern, and the number of undetected faults meets a desired condition.

9. The method as set forth in claim 8, wherein generation of a test pattern is finished, if at least one of following conditions exists:

(A) the fault detecting rate is equal to or greater than a desired fault detecting rate;

(B) the number of test patterns is equal to or greater than a desired number of test patterns;

(C) the period of time necessary for generating a test pattern is equal to or longer than a desired period of time; and (D) the number of undetected faults is equal to zero.

10. The method as set forth in claim 1, further comprising receiving from an external storage unit circuit data and fault for generating a test pattern.

11. The method as set forth in claim 1, further comprising transmitting data about all generated test patterns and data about all corrected faults to an external storage unit if it is judged that generation of a test pattern is judged to be undertaken.

12. The method as set forth in claim 1, further comprising repeating judging of whether generation of a test pattern is to be undertaken if at least one test pattern has not been generated.

13. The method as set forth in claim 1, further comprising selecting said first or second logical value through a pseudo-random number process.

14. An apparatus for generating a pattern for testing a logic circuit, said apparatus comprising:

a judging unit for judging whether generation of a test pattern is to be undertaken;

a first identifier unit, responsive to said judging unit judging that generation of a test pattern is to be undertaken, for identifying, from among undetected faults, faults which can be detected by at least one test pattern;

a selector for selecting, from among identified faults, a fault for which a test pattern is to be generated;

a pattern generator for attempting to generate at least one test pattern for detecting the fault selected by said selector;

a second identifier unit for identifying, from among external input terminals, each being part of at least one test pattern, external input terminals which are not necessary for detecting the selected fault;

a first device for applying undefined values to the identified external input terminals;

a copier for making L copies of the at least one test pattern, where L is an integer equal to or greater than 2;

a second device for applying a first logical value or a second logical value to the undefined values in each of the copies of the at least one test pattern such that the copies of the at least one test pattern are different from one another;

a fault simulator for carrying out fault simulation of undetected faults through the use of the at least one test pattern, to find among the L copies of the at least one test pattern a test pattern by which the most undetected faults are detected, and for re-activating the found test pattern, if at least one test pattern has been generated by said pattern generator.

15. The apparatus as set forth in claim 14, wherein said fault simulator includes a sampler for sampling at a rate of one undetected fault out of M undetected faults to select the undetected faults.

16. The apparatus as set forth in claim 14, wherein said fault simulator carries out parallel pattern parallel fault (PPPF) simulation of the undetected faults.

17. The apparatus as set forth in claim 14, wherein said fault simulator carries out single pattern parallel fault (SPPF) simulation of all undetected faults.

18. The apparatus as set forth in claim 14, wherein:
said judging unit judges whether said simulator has carried out re-activation of the test pattern N times, where N is an integer equal to or greater than 1; and
said simulator carries out fault simulation of undetected faults that have not been detected, if said simulator has carried out re-activation N times.

19. The apparatus as set forth in claim 14, further comprising an output for outputting the found test pattern.

20. The apparatus as set forth in claim 14, wherein said judging unit judges whether generation of a test pattern is to be undertaken based on whether at least one of a fault detecting rate, the number of test patterns, a period of time necessary for generating a test pattern, and the number of undetected faults meets a desired condition.

21. The apparatus as set forth in claim 20, wherein generation of a test pattern is finished, if at least one of following conditions exists:

(A) the fault detecting rate is equal to or greater than a desired fault detecting rate;

(B) the number of test patterns is equal to or greater than a desired number of test patterns;

(C) the period of time necessary for generating a test pattern is equal to or longer than a desired period of time; and (D) the number of undetected faults is equal to zero.

22. The apparatus as set forth in claim 14, further comprising a receiver for receiving from an external storage unit circuit data and fault data for generating a test pattern.

23. The apparatus as set forth in claim 14, further comprising a transmitter for transmitting data about all generated test patterns and data about all corrected faults if it is judged that generation of a test pattern is to be undertaken.

24. The apparatus as set forth in claim 14, wherein said second device selects said first or second logical value through a pseudo-random number process.

* * * * *